(12) United States Patent
Zhu

(10) Patent No.: US 9,450,100 B2
(45) Date of Patent: Sep. 20, 2016

(54) SEMICONDUCTOR ARRANGEMENTS AND METHODS OF MANUFACTURING THE SAME

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 14/763,407

(22) PCT Filed: Mar. 12, 2013

(86) PCT No.: PCT/CN2013/072445
§ 371 (c)(1),
(2) Date: Jul. 24, 2015

(87) PCT Pub. No.: WO2014/121538
PCT Pub. Date: Aug. 14, 2014

(65) Prior Publication Data
US 2015/0364605 A1    Dec. 17, 2015

(30) Foreign Application Priority Data
Feb. 8, 2013  (CN) .......................... 2013 1 0050137

(51) Int. Cl.
| H01L 29/66 | (2006.01) |
| H01L 29/78 | (2006.01) |
| H01L 21/8234 | (2006.01) |
| H01L 27/088 | (2006.01) |

(Continued)

(52) U.S. Cl.
CPC ... *H01L 29/7855* (2013.01); *H01L 21/823431* (2013.01); *H01L 21/823437* (2013.01); *H01L 27/0886* (2013.01); *H01L 29/0638* (2013.01); *H01L 29/4238* (2013.01); *H01L 29/42356* (2013.01); *H01L 29/42364* (2013.01); *H01L 29/66484* (2013.01); *H01L 29/66795* (2013.01); *H01L 29/7848* (2013.01)

(58) Field of Classification Search
CPC .................. H01L 29/7855; H01L 21/823437; H01L 29/7848; H01L 21/823431; H01L 29/66484; H01L 29/0638; H01L 29/42356; H01L 29/4238; H01L 27/0886; H01L 29/42364; H01L 29/66795
See application file for complete search history.

(56) References Cited

U.S. PATENT DOCUMENTS 7,842,566 B2    11/2010  Lee et al.
9,209,280 B2 *  12/2015  Tsai .................... H01L 21/2254
(Continued)

FOREIGN PATENT DOCUMENTS

| CN | 1728400 A | 2/2006 |
| CN | 100459161 C | 2/2009 |

(Continued)

*Primary Examiner* — Thanh Y Tran
(74) *Attorney, Agent, or Firm* — Christensen Fonder P.A.

(57) ABSTRACT

A semiconductor arrangement that includes: a substrate; a back gate formed on the substrate; fins formed on opposite sides of the back gate; and back gate dielectric layers interposed between the back gate and the respective fins. The back gate has opposite end portions recessed with respect to a middle portion thereof between the end portions, so that an overlap area between each of the end portions and each of the fins is smaller than an overlap area between the middle portion and the fin.

26 Claims, 20 Drawing Sheets

(51) Int. Cl.
  *H01L 29/06* (2006.01)
  *H01L 29/423* (2006.01)

(56) References Cited

U.S. PATENT DOCUMENTS

| | | |
|---|---|---|
| 2006/0022253 A1 | 2/2006 | Anderson et al. |
| 2006/0267111 A1 | 11/2006 | Anderson et al. |
| 2007/0026615 A1* | 2/2007 | Goktepeli ............ H01L 29/785 438/281 |
| 2009/0206406 A1* | 8/2009 | Rachmady ........ H01L 21/28114 257/365 |
| 2011/0101456 A1* | 5/2011 | Hoentschel ........... H01L 29/045 257/347 |
| 2012/0091538 A1 | 4/2012 | Lin et al. |

FOREIGN PATENT DOCUMENTS

| | | |
|---|---|---|
| CN | 100527442 C | 8/2009 |
| CN | 102446794 A | 5/2012 |
| CN | 102446974 A | 5/2012 |

* cited by examiner (a)

(a)

(b)

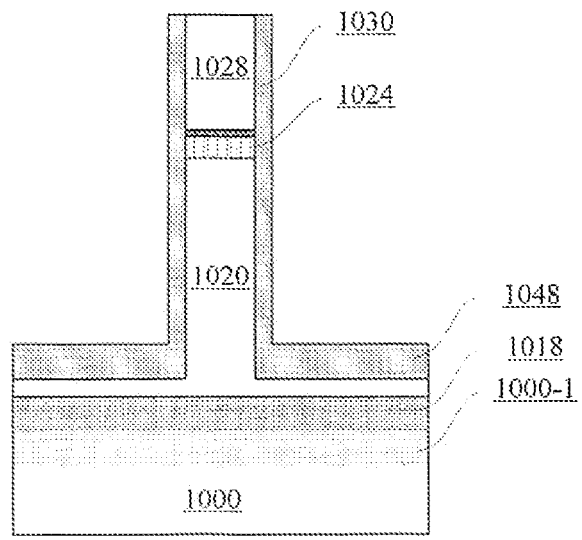
(c)
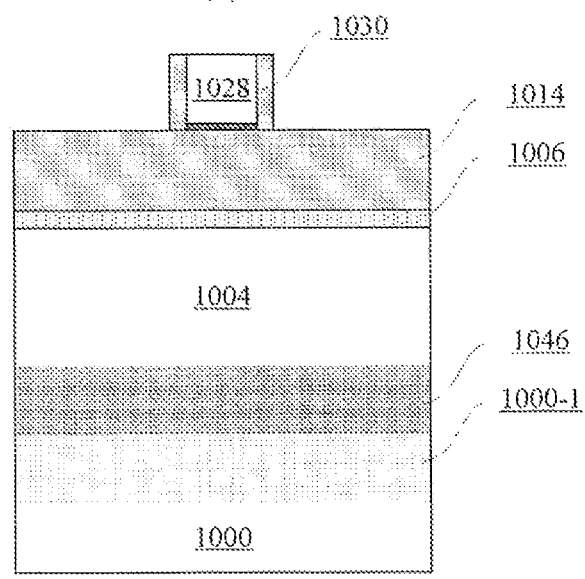
(d)

SEMICONDUCTOR ARRANGEMENTS AND METHODS OF MANUFACTURING THE SAME

CROSS-REFERENCE TO RELATED APPLICATION(S)

This application is a U.S. national phase application of PCT Application No. PCT/CN2013/072445 filed on Mar. 12, 2013, entitled "SEMICONDUCTOR ARRANGEMENTS AND METHODS OF MANUFACTURING THE SAME," which claims priority to Chinese Application No. 201310050137.3 filed on Feb. 8, 2013. Both the PCT Application and the Chinese Application are incorporated herein by reference in their entireties.

TECHNICAL FIELD

The present disclosure relates to the semiconductor field, and particularly, to semiconductor arrangements comprising fin structures and methods of manufacturing the same.

BACKGROUND

To deal with challenges caused by continuous scaling down of semiconductor devices, such as short channel effects, various high-performance devices, such as Ultra Thin Buried oxide and Body (UTBB) and FinFET (Fin Field Effect Transistor) devices, are proposed.

The UTBB device utilizes an Extremely Thin-Semiconductor On Insulator (ET-SOI) substrate. The SOI substrate can suppress the short channel effects due to a Buried Oxide (BOX) therein. Further, a back gate may be disposed on a back side of the SOI substrate, to control a threshold voltage of the device, and thus to reduce power consumption of the device (by, for example, enhancing the threshold voltage when the device is off and thus reducing current leakage). However, the ET-SOI substrate is significantly expensive and has problems such as self-heating. Further, the ET-SOI substrate is more and more difficult to manufacture with the continuous scaling down trend.

The FinFET device is a 3D device, including a fin vertically formed on a substrate. A conductive channel may be formed in the fin. The fin may have its height increased while keeping its footprint unchanged, and thus may have an improved drive current per unit footprint. However, the FinFET device cannot effectively control its threshold voltage. Further, the fin becomes thinner and thinner with the continuous scaling down trend, and tends to collapse during manufacture.

SUMMARY

The present disclosure provides, among others, semiconductor arrangements and methods of manufacturing the same.

According to an aspect of the present disclosure, there is provided a semiconductor arrangement, comprising: a substrate; a back gate formed on the substrate; fins formed on opposite sides of the back gate; and back gate dielectric layers interposed between the back gate and the respective fins, wherein the back gate has opposite end portions recessed with respect to a middle portion thereof between the end portions, so that an overlap area between each of the end portions and each of the fins is smaller than an overlap area between the middle portion and the fin.

According to a further aspect of the present disclosure, there is provided a method of manufacturing a semiconductor arrangement, comprising: forming a back gate groove in a substrate; forming back gate dielectric layers on sidewalls of the back gate groove; forming a back gate by filling a conductive material into the back gate groove; forming fins abutting the respective back gate dielectric layers by patterning the substrate; and patterning the back gate in such a manner that the back gate has opposite end portions recessed with respect to a middle portion thereof between the end portions, so that an overlap area between each of the end portions and each of the fins is smaller than an overlap area between the middle portion and the fin.

According to embodiments of the present disclosure, the back gate is interposed between the fins, resulting in a sandwich Fin (which is referred to in brief as sFin) configuration. Based on the sFin configuration, various devices such as sandwich Fin Field Effect Transistor (sFinFET) can be made. In such an sFin based device, it is possible not only to effectively control a threshold voltage of the device by the back gate, but also to improve its reliability by the back gate serving as a support for the fins.

Further, the back gate may be patterned to have the opposite end portions recessed with respect to the middle portion thereof between the end portions (and thus looks like "⊥"), so that the overlap area between each of the end portions and each of the fins is smaller than the overlap area between the middle portion and the fin. Such a configuration is particularly advantageous in the devices such as sFinFETs, to, for example, reduce capacitances between source/drain regions and the back gate.

BRIEF DESCRIPTION OF THE DRAWINGS

The above and other objects, features, and advantages of the present disclosure will become apparent from following descriptions of embodiments with reference to the attached drawings, in which.

DETAILED DESCRIPTION

Figure 1:
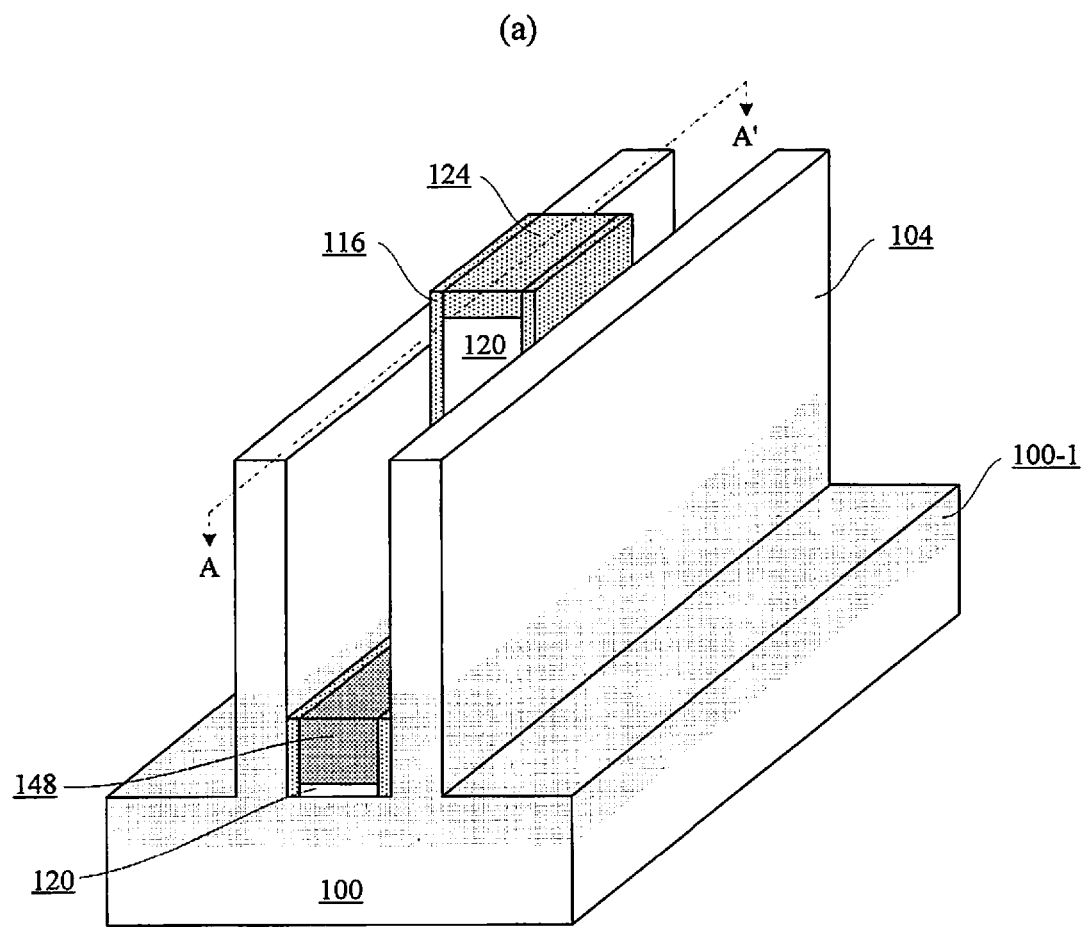
FIG. 1(a) is a perspective view showing a semiconductor arrangement according to an embodiment of the present disclosure.
FIG. 1(b) is a perspective view showing the semiconductor arrangement of FIG. 1(a) which is cut off along line A-A.
Figure 1:
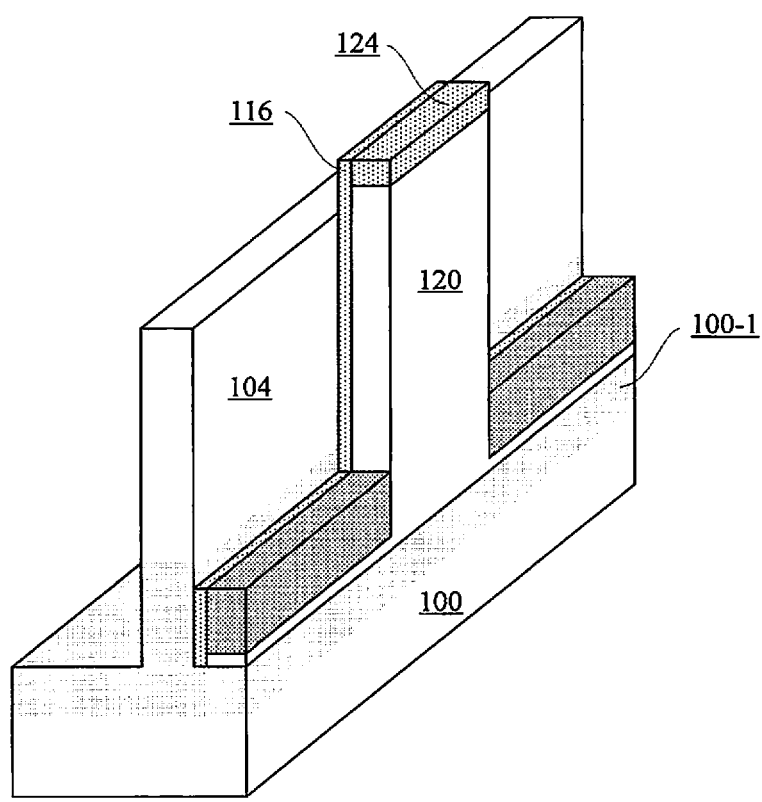

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances and technique limitations in practice. Those skilled in the art can also devise regions/layers of other different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

According to embodiments of the present disclosure, there is provided a semiconductor arrangement. The semiconductor arrangement may comprise a sandwich Fin (sFin) configuration formed on a substrate, such as a bulk semiconductor substrate. For example, the sFin configuration comprises two fins and a back gate interposed between the two fins. The respective fins and the back gate may be spaced apart from each other by gate dielectric layers. As a result, it is possible to control the fins by applying a bias to the back gate. In an example, the fins may be formed from portions of the substrate by patterning the substrate. Alternatively, the fins may be formed by growing and then patterning an epitaxial layer on the substrate.

According to an embodiment of the present disclosure, the back gate of the sFin may be shaped in such a manner that opposite end portions thereof are recessed with respect to a middle portion thereof between the end portions (and thus looks as a whole like " ⊥ "), so that an overlap area between each of the end portions and each of the fins is smaller than an overlap area between the middle portion and the fin. The back gate may be in electric contact with the substrate. Thus, it is possible to apply the bias to the back gate via the substrate. To improve an efficiency of applying the bias, a well region may be formed in the substrate so that the back gate is in electric contact with the well region. The bias may be applied to the back gate through an electric contact to the well region. To further reduce a contact resistance between the back gate and the well region, a contact region may be formed in the well region at a position corresponding to the back gate. The contact region may have a greater doping concentration than that of the well region. The end portions of the back gate each may have a thickness, which is preferably greater than zero (though it may be zero and thus such "end portions" are absent actually), to facilitate the electric contact of the back gate to the substrate (specifically, the well region therein).

According to embodiments of the present disclosure, various semiconductor devices such as sFinFETs may be formed based on the sFin. Though the sFin comprises the back gate, it still looks like a fin as a whole. Therefore, existing FinFET manufacture processes and apparatuses are applicable to manufacture of sFinFETs. There is no need to newly develop manufacture processes and apparatuses for application of the technology disclosed herein.

The sFinFET may comprise a gate stack formed on the substrate and intersecting the sFin. To electrically isolate the gate stack from the substrate, the sFinFET may comprise an isolation layer formed on the substrate and exposing a portion of each of the fins of the sFin (which portion serves as a "real" fin for the sFinFET when it is completed), and the gate stack is disposed on the isolation layer. Because bottom portions of the fins are covered by the isolation layer, the gate stack cannot effectively control the bottom portions of the fins. As a result, there may be current leakage between source and drain regions via the bottom portions. To suppress the current leakage, the sFinFET may comprise a Punch-Through Stopper (PTS) formed beneath the exposed portions of the fins. For example, the PTS may be disposed substantially in the portions of the fins of the sFin covered by the isolation layer.

The gate stack defines a channel region (corresponding to a portion of each of the fins intersecting the gate stack) and thus source/drain regions (corresponding to portions of each of the fins on opposite sides of the channel region) in each of the fins. In this example, the middle portion of the back gate may correspond to the channel region. Thus, it is possible to effectively control the fins (especially, the channel region therein) through the back gate (especially, the middle portion thereof) on one hand, and to reduce capacitances between the source/drain regions and the back gate (due to the reduced overlap area between the end portions and the fins) on the other hand.

A dielectric layer may be disposed on top of the bake gate, to electrically isolate the back gate from other components (for example, the gate stack and the source/drain regions). Further, in a case where the PTS is disposed as described above, portions of the dielectric layer on top of the end portions of the back gate may have a top surface lying between a top surface and a bottom surface of the PTS.

According to embodiments, to improve the device performances, the strained source/drain technology may be applied. For example, the source/drain regions may comprise a semiconductor layer having a material different from that of the fins to apply stress to the channel region. For example, for a p-type device, compressive stress may be applied; or for an n-type device, tensile stress may be applied.

According to embodiments of the present disclosure, the sFin may be formed as follows. For example, a back gate groove may be formed in a substrate, and a back gate may be formed by filling a conductive material, such as metal or doped poly silicon, into the back gate groove. Before filling the back gate groove, back gate dielectric layers may be formed on sidewalls of the back gate groove. In an example, the back gate dielectric layers may be formed in a spacer formation process for simplification. Next, the substrate may be patterned to form fins abutting the respective back gate dielectric layers. For example, the substrate may be patterned in such a manner that (fin-like) portions of the substrate are left on the sidewalls of the back gate groove (specifically, on the respective back gate dielectric layers formed on the sidewalls of the back gate groove). Then, the back gate may be further patterned in such a manner that the back gate has opposite end portions recessed with respect to a middle portion thereof between the end portions, so that an overlap area between each of the end portions and each of the fins is smaller than an overlap area between the middle portion and the fin.

For convenience of patterning of the back gate groove and the fins, in an example a patterning auxiliary layer may be formed on the substrate. The patterning auxiliary layer may be patterned to have an opening at a position corresponding to the back gate groove, and a pattern transfer layer may be formed on sidewalls of the patterning auxiliary layer facing the opening. Thus, the patterning of the back gate groove (referred to as "first patterning" hereinafter) may be performed with the patterning auxiliary layer and the pattern transfer layer as a mask. Further, the patterning of the fins (referred to as "second patterning" hereinafter) may be performed with the pattern transfer layer as a mask.

In this way, the fins are formed by two times of patterning: the first patterning in which one side surface of each of the fins is formed, and the second patterning in which the other side surface of each of the fins is formed. During the first patterning, the fins are still connected to and thus are supported by the body of the substrate. Further, during the second patterning, the fins are connected to and thus are supported by the back gate. As a result, it is possible to prevent the fins from collapsing during their manufacture, and thus to manufacture the relatively thin fins at a greater yield.

Before the second patterning, a dielectric layer may be formed in the back gate groove to cover the back gate. The dielectric layer may electrically isolate the back gate (from, e.g., the gate stack) on one hand, and may prevent impacts of the second patterning on the back gate on the other hand.

Further, for convenience of patterning, in an example the pattern transfer layer may be formed on the sidewalls of the patterning auxiliary layer in a spacer formation process. Because the spacer formation process needs no mask, it is possible to reduce a number of masks used in the manufacture.

According to an embodiment, the substrate may comprise any of Si, Ge, SiGe, GaAs, GaSb, AlAs, InAs, InP, GaN, SiC, InGaAs, InSb, or InGaSb, and the patterning auxiliary layer may comprise amorphous silicon. In this case, to avoid unwanted etching of the patterning auxiliary layer during the patterning of the back gate groove, a protection layer may be formed on a top surface of the patterning auxiliary layer. Further, before formation of the patterning auxiliary layer, a stop layer may be formed on the substrate. Patterning of the patterning auxiliary layer (to form the opening therein) may stop on the stop layer. For example, the protection layer may comprise nitride (e.g., silicon nitride), the pattern transfer layer may comprise nitride, and the stop layer may comprise oxide (e.g., silicon oxide).

Further, according to embodiments of the present disclosure, an sFinFET may be manufactured based on the resultant sFin as described above. For example, an isolation layer may be formed on the substrate with the sFin formed thereon to expose a portion of the sFin (especially, the fins thereof). Then, a gate stack may be formed on the isolation layer to intersect the sFin.

In the sFinFET example, the patterning of the back gate may be carried out with the gate stack as a mask. Specifically, the gate stack defines a middle portion of the back gate (corresponding to a portion of the back gate intersecting the gate stack), and thus defines end portions (corresponding to portions of the back gate on opposite sides of the middle portion). As a result, the middle portion of the back gate and the channel region in the fins can be self-aligned to each other. Therefore, it is possible to effectively control the channel region and thus control a threshold of the sFinFET.

In patterning the back gate, the end portions of the back gate may be partially removed, or even completely removed. In a space left in the back gate groove due to the (partial) removal of the end portions of the back gate, a further dielectric layer may be formed, to cover remaining portions of the end portions (or to cover the substrate if the end portions are completely removed), to electrically isolate the end portions (from, e.g., the source/drain regions).

According to further embodiments of the present disclosure, the back gate dielectric layers may be patterned to remove at least partially portions thereof exposed by the patterned back gate. Thus, (at least a portion of) a surface of each of the fins facing the back gate can be exposed. Then, on the surface of the fin, a semiconductor layer may be formed by, e.g., epitaxy, to effectively expand the source/drain regions and thus to facilitate resistance reduction of the source/drain regions.

To form the PTS as described above, ion implantation may be performed after the formation of the isolation layer and before the formation of the gate stack. Due to a formal factor of the sFin and various dielectric layers on top thereof (for example, the pattern transfer layer and the like), the PTS can be disposed substantially in portions of the fins of the sFin covered by the isolation layer. Then, the dielectric layers on top of the sFin (for example, the pattern transfer layer and the like) may be removed. Thus, the later formed gate stack may contact exposed side and top surfaces of the fins.

The technology disclosed herein may be presented in various ways, some of which will be described in the following by way of example.

FIG. 1(a) is a perspective view showing a semiconductor arrangement according to an embodiment of the present disclosure, and FIG. 1(b) is a perspective view showing the semiconductor arrangement of FIG. 1(a) which is cut off along line A-A'.

As shown in FIGS. 1(a) and 1(b), the semiconductor arrangement comprises a substrate 100, for example, a bulk semiconductor substrate such as Si, Ge, or the like, a compound semiconductor substrate such as SiGe, GaAs, GaSb, AlAs, InAs, InP, GaN, SiC, InGaAs, InSb, InGaSb, or the like, a Semiconductor on Insulator (SOI) substrate, or the like. For convenience, a bulk silicon substrate and silicon system materials are described by way of example in the following.

The semiconductor arrangement further comprises a sFin configuration formed on the substrate. Specifically, the sFin configuration may comprise two fins 104 formed on the substrate and a back gate 120 interposed between the fins. The fins 104 each may have a width of about 3-28 nm for example, and are separated from the back gate 120 by respective back gate dielectric layers 116. The back gate dielectric layers 116 each may comprise a suitable dielectric material, e.g., oxide (silicon oxide, for example), with an equivalent thickness (i.e., a dimension in a horizontal direction in the sheet) of about 10-30 nm. The back gate 120 may comprise a suitable conductive material, such as doped poly silicon, with a width (i.e., a dimension in the horizontal direction in the sheet) of about 5-30 nm. The back gate 120 may be in electric contact with the substrate 100. Thus, it is possible to apply a bias to the back gate 120 via the substrate 100. To do this, the substrate 100 may comprise a well region 100-1 to enhance the electric contact with the back gate 120.

In the example shown in FIG. 1, the fins 104 are formed from portions of the substrate 100 and thus integral with the substrate 100. The well region 100-1 is shown in FIG. 1 as extending into the fins 104. However, the present disclosure is not limited thereto. For example, the well region 100-1 may be disposed in portions of the substrate beneath the fins 104, without extending into the fins 104 (especially in a case where a punch-through stopper is formed in bottom portions of the fins 104 as described in the following).

As shown in FIG. 1(b), the back gate 120 is shaped in such a manner that opposite end portions thereof are recessed with respect to a middle portion thereof between the end portions (and thus looks as a whole like " ⊥ "), so that an overlap area between each of the end portions and each of the fins 104 is smaller than an overlap area between the middle portion and the fin 104.

FIG. 1 also shows dielectric layers on a top surface of the back gate 120, including a dielectric layer 124 on top of the middle portion and a dielectric layer 148 on top of the end portions. Those dielectric layers may electrically isolate the back gate 120 from other components (e.g., a gate stack and source/drain regions) formed on a front side (the upper side in FIG. 1) of the substrate. The dielectric layer 124 and the dielectric layer 148 may comprise the same material or different materials. For example, the dielectric layer 124 may comprise oxide (e.g., silicon oxide), and the dielectric layer 148 may comprise nitride (e.g., silicon nitride).

In the example shown in FIG. 1, the back gate dielectric layers 116 each are patterned to coincide in shape with the back gate 120 together with the dielectric layers 124 and 148. Thus, a side surface of each of the fins 104 facing the back gate 120 may be exposed. Then, a semiconductor layer may be formed by, e.g., epitaxy, on opposite side surfaces of each of the fins 104. This semiconductor layer may even connect the two fins 104 together.

Figure 2:
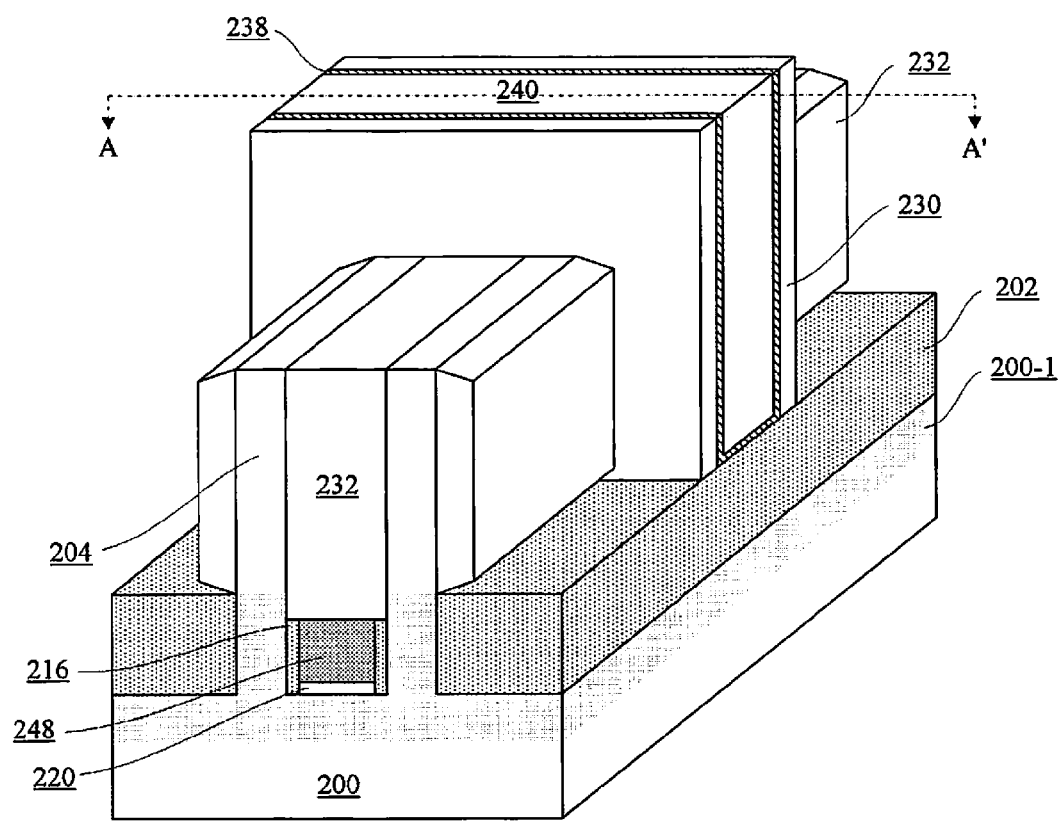
FIG. 2 is a perspective view showing a semiconductor arrangement according to a further embodiment of the present disclosure.
Figure 3:
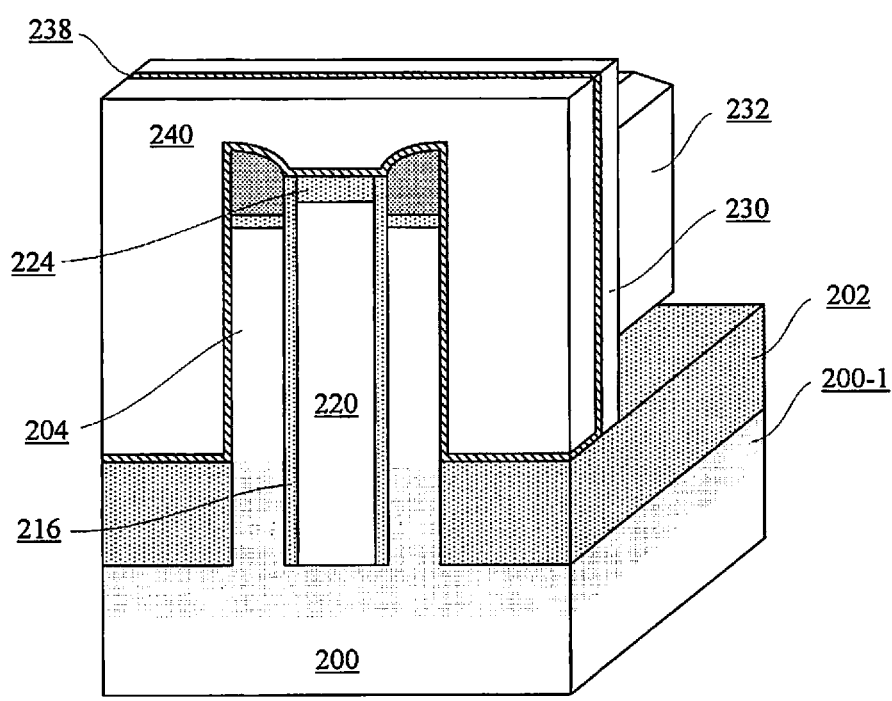
FIG. 3 is a perspective view showing the semiconductor arrangement of FIG. 2 which is cut off along line A-A.

FIG. 2 is a perspective view showing a semiconductor arrangement according to a further embodiment of the present disclosure, and FIG. 3 is a perspective view showing the semiconductor arrangement of FIG. 2 which is cut off along A-A'. Likewise, the semiconductor arrangement shown in FIGS. 2 and 3 comprises a substrate 200 and an sFin formed on the substrate 200. Similarly to the embodiment shown in FIG. 1, the sFin may comprise two fins 204 formed on the substrate and a back gate 220 interposed between the fins. The fins 204 are separated from the back gate 220 by respective back gate dielectric layers 216. To improve electric contact between the back gate 220 and the substrate 200, the substrate 200 may comprise a well region 200-1. For structural parameters and materials of those elements, reference may be made to the above descriptions with reference to FIG. 1.

Further, the semiconductor arrangement further comprises an isolation layer 202 formed on the substrate 200 and a gate stack formed on the isolation layer 202 and intersecting the sFin. For example, the isolation layer 202 may comprise oxide. The gate stack may comprise a gate dielectric layer 238 and a gate conductor layer 240. For example, the gate dielectric layer 238 may comprise a high-K dielectric material such as HfO₂, with a thickness of about 1-5 nm, and the gate conductor layer 240 may comprise a metal gate conductor. Further, the gate dielectric layer 238 may further comprise a thin oxide layer (on which the high-K gate dielectric layer is disposed), with a thickness of about 0.3-1.2 nm. A work function adjustment layer (not shown) may be disposed between the gate dielectric layer 238 and the gate conductor 240. Further, gate spacers 230 may be formed on opposite sides of the gate stack. For example, the gate spacers 230 each may comprise nitride, with a thickness of about 5-20 nm.

In this example, a portion of the back gate 220 underlying the gate stack corresponds to a "middle portion" thereof, and portions of the back gate 220 on opposite sides of the gate stack correspond to "end portions" thereof. Likewise, the back gate 220 is shaped in such a manner that the end portions are recessed with respect to the middle portion, and thus looks as a whole like "⊥". As a result, an overlap area between each of the end portions and each of the fins 104 is smaller than an overlap area between the middle portion and the fin 104. In the middle portion, the back gate 220 is isolated from the gate stack by a dielectric layer 224 on top thereof.

Due to the presence of the gate stack, a channel region (corresponding to a portion of each of the fins intersecting the gate stack) and source/drain regions (corresponding to portions of each of the fins on opposites sides of the channel region) are defined in the sFin. In the semiconductor arrangement shown in FIG. 2, a semiconductor layer 232 may be further grown on surfaces of the fins in the source/drain regions. The semiconductor layer 232 may comprise a material different from that of the fins 204, to apply stress to the fins 204 (especially, the channel regions therein). For example, in a case where the fins 204 comprise Si, the semiconductor layer 232 may comprise Si:C (where an atomic percentage of C is about 0.2-2%, for example) for an n-type device to apply tensile stress, or SiGe (where an atomic percentage of Ge is about 15-75%, for example) for a p-type device to apply compressive stress. Further, the semiconductor layer 232 expands the source/drain regions, facilitating formation of contacts to the source/drain regions.

In the example shown in FIG. 2, the back gate dielectric layers 216 are each patterned to expose at least partially the surfaces of the fins 204 facing the back gate 220. As a result, the semiconductor layer 232 is also formed on those surfaces. For example, the two fins 204 may be connected together by the semiconductor layer 232, as shown in FIG. 2. As a result, there is substantially no conductor-dielectric-conductor arrangement (which will lead to capacitance) in the source/drain regions. In the end portions, the back gate 220 may be isolated from the source/drain regions (the semiconductor layer 232 in this example) by a dielectric layer 248 on a top surface thereof.

As shown in FIG. 3, the gate stack intersects a side surface (opposite to the back gate 220) of each of the fins 204. Specifically, the gate dielectric layer 238 may be in contact with the side surface of each of the fins 204, and thus the gate conductor layer 240 may control generation of conductive channels on the side surface of each of the fins 204 via the gate dielectric layer 238.

In the example shown in FIGS. 2 and 3, some layers are shown on top of the fins 204. For example, those layers are caused during manufacture of the semiconductor arrangement, and may have no substantial impacts on the structure and operations of the semiconductor arrangement. According to some embodiments, those layers may be removed.

FIGS. 4-25 are schematic views showing a flow of manufacturing a semiconductor arrangement according to an embodiment of the present disclosure.

Figure 4:
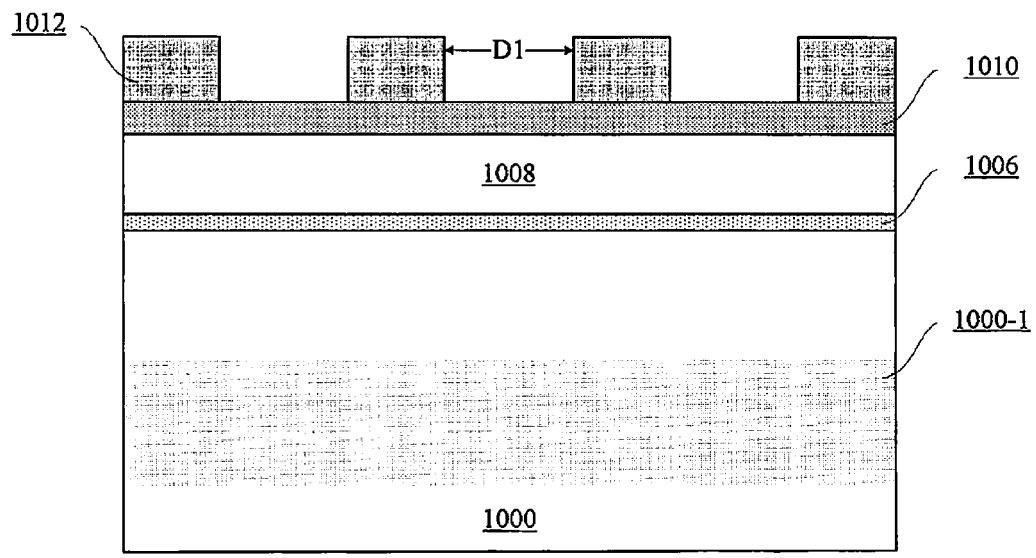
FIGS. 4-25 are schematic views showing a flow of manufacturing a semiconductor arrangement according to an embodiment of the present disclosure.

As shown in FIG. 4, a substrate 1000, such as a bulk silicon substrate, is provided. In the substrate 1000, a well region 1000-1 may be formed by, for example, ion implantation. For example, the well region may be formed to have an n-type conductivity for a p-type device, or a p-type conductivity for an n-type device. The n-type well region may be formed by implanting n-type impurities such as P or As into the substrate 1000, and the p-type well region may be formed by implanting p-type impurities such as B into the substrate 1000. Annealing may be performed after the implantation if needed. There are various ways to form the n-type well or p-type well, and detailed descriptions thereof are omitted here.

On the substrate 1000, a stop layer 1006, a pattering auxiliary layer 1008 and a protection layer 1010 may be sequentially formed. The stop layer 1006 may comprise oxide (e.g., silicon oxide) with a thickness of about 5-25 nm, the pattering auxiliary layer 1008 may comprise amorphous silicon with a thickness of about 50-200 nm, and the protection layer 1010 may comprise nitride (e.g., silicon nitride) with a thickness of about 5-15 nm. The materials for those layers are selected to provide etching selectivity in later processes. It is to be understood by those skilled in the art that those layers may comprise other suitable materials, and that some of them may be even omitted in some cases.

Next, a photoresist layer 1012 may be formed on the protection layer 1010. The photoresist layer 1012 may be patterned by, e.g., photolithography, to form openings therein at positions corresponding to back gates to be formed. The openings each may have a width D1 of about 15-100 nm.

Figure 5:
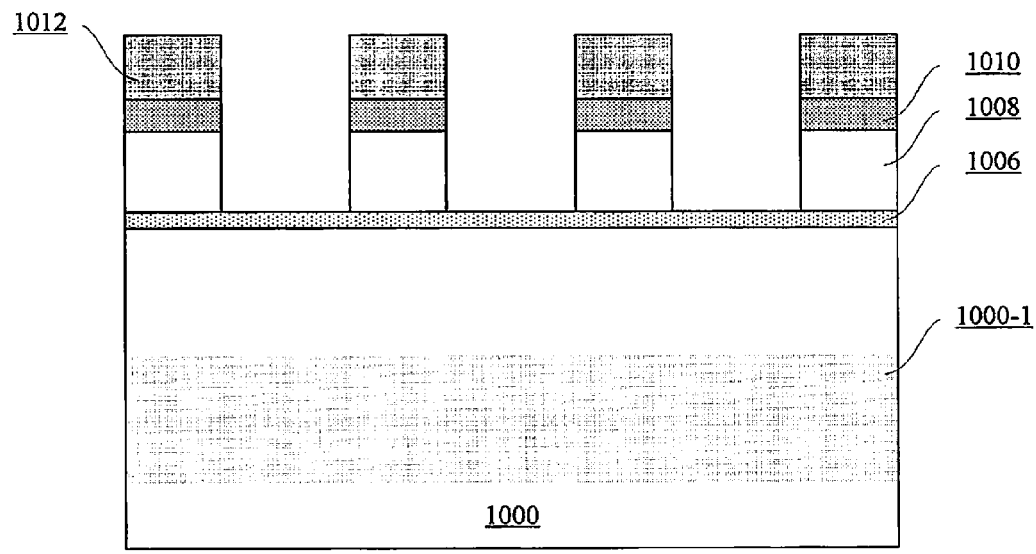

Then, as shown in FIG. 5, the protection layer 1010 and the patterning auxiliary layer 1008 may be sequentially etched by, e.g., Reactive Ion Etching (RIE), with the photoresist layer 1012 as a mask, to form openings in the protection layer 1010 and the patterning auxiliary layer 1008. The etching may stop on the stop layer 1006. If the patterning auxiliary layer 1008 and the underlying substrate 1000 have sufficient etching selectivity with respect to each other, the stop layer 1006 may be even omitted. Then, the photoresist layer 1012 may be removed.

Figure 6:
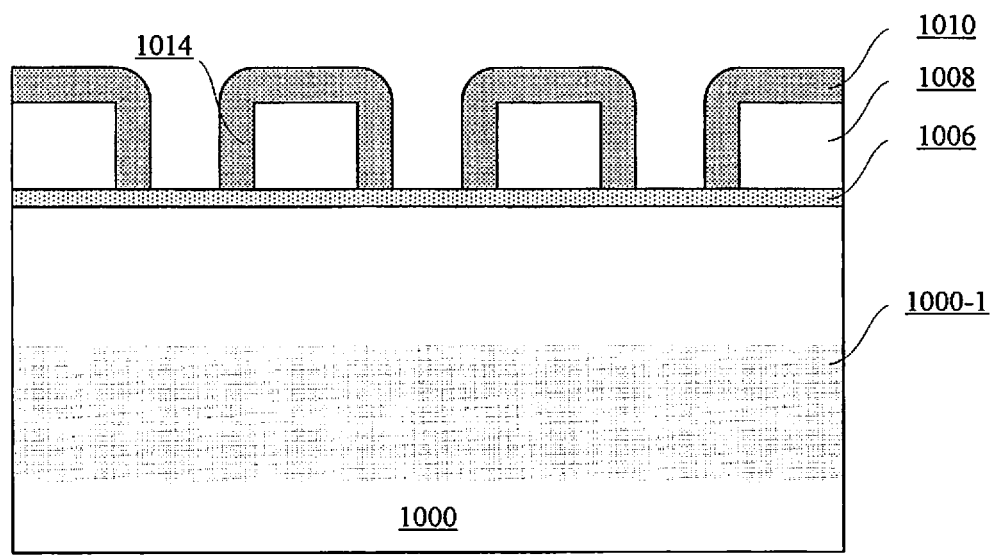

Then, as shown in FIG. 6, a pattern transfer layer 1014 may be formed on sidewalls of the patterning auxiliary layer 1008 (facing the openings). The pattern transfer layer 1014 may be formed in a spacer formation process. For example, a nitride layer may be deposited on a surface of the arrangement shown in FIG. 5 (with the photoresist layer 1012 removed), and then etched by RIE to form the pattern transfer layer as spacers. The deposited nitride layer may have a thickness of about 3-28 nm (which substantially determines a width of a fin to be formed). The deposition may comprise Atom Layer Deposition (ALD). There are various ways to form such spacers, and detailed descriptions thereof are omitted here.

Figure 7:
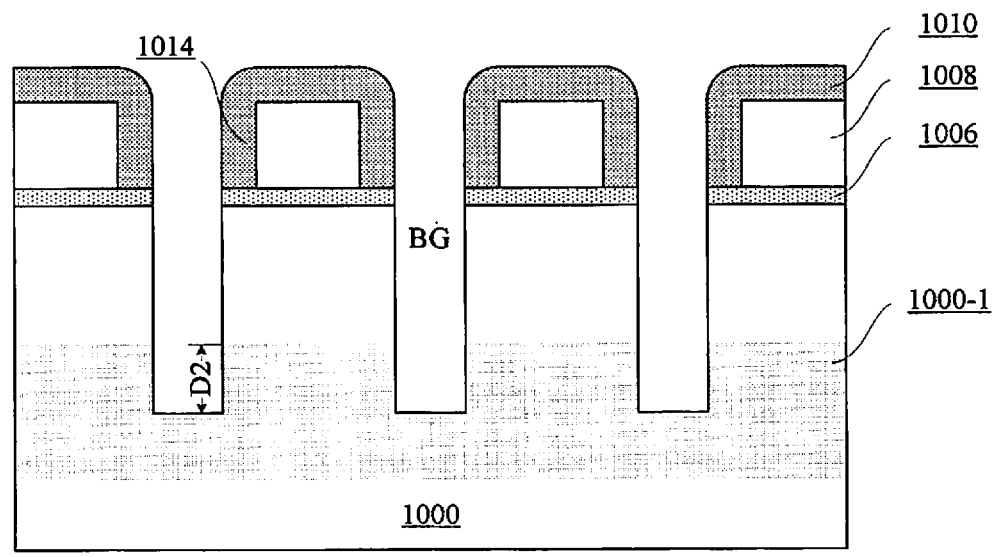

Next, as shown in FIG. 7, the substrate 1000 may be patterned with the patterning auxiliary layer 1008 and the pattern transfer layer 1014 as a mask, to form back gate grooves BG therein. Here, the stop layer 1006 and the substrate 1000 may be sequentially etched by RIE, to form the back gate grooves BG. Due to the presence of the protection layer 1010, the RIE has substantially no impact on the patterning auxiliary layer 1008. If the patterning auxiliary layer 1008 has sufficient etching selectivity with respect to the stop layer 1006 and the substrate 1000, the protection layer 1010 may be even omitted.

According to an embodiment, the back gate grooves BG may extend into the well region 1000-1. For example, a bottom surface of the back gate groove BG is recessed with respect to a top surface of the well region 1000-1 or a bottom of a channel region of a completed sFinFET by a depth of D2, as shown in FIG. 7. D2 may fall between about 10-30 nm.

Figure 8:
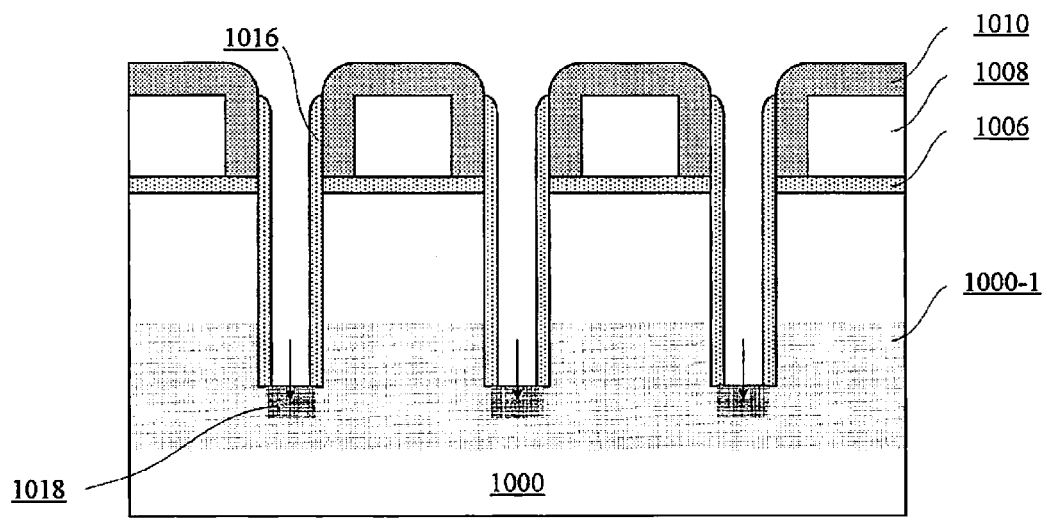

Subsequently, as shown in FIG. 8, back gate dielectric layers 1016 may be formed on sidewalls of the back gate grooves BG. The back gate dielectric layers 1016 may comprise any suitable dielectric material, for example, oxide or a high-K dielectric material such as $HfO_2$. Here, the back gate dielectric layers 1016 may be formed in a spacer formation process. For example, an oxide layer with an equivalent thickness (EOT) of about 10-30 nm may be deposited on a surface of the arrangement of FIG. 7 by thermal oxidization, and then etched by RIE, to form the back gate dielectric layers as spacers.

Here, to reduce a contact resistance between the back gates to be formed and the substrate, ion implantation may be performed through the back gate grooves BG, as shown by arrows in FIG. 8, to form contact regions 1018 in the substrate 1000 (especially, in the well region 1000-1). The ion implantation has the same doping polarity as the well region, and thus the contact regions 1018 may have a greater doping concentration (e.g., $1E18$-$1E21$ $cm^{-3}$) than that of the well region 1000-1. Due to D2 (referring to FIG. 7), it is possible to prevent dopants in the ion implantation from entering into fins to be formed later.

Figure 9:
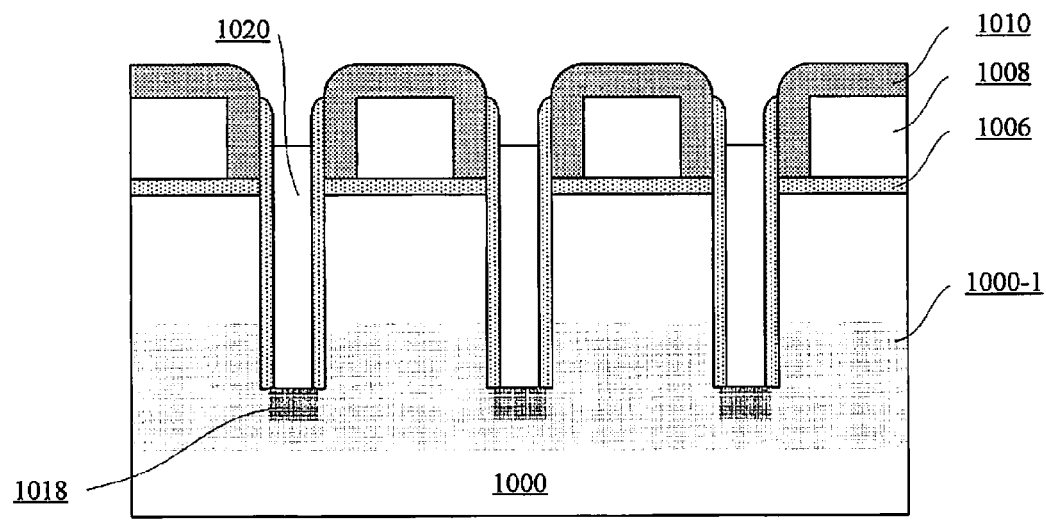

Then, as shown in FIG. 9, a conductive material may be filled into the back gate grooves BG, to form the back gates 1020. The back gates 1020 may comprise doped (and thus conductive) semiconductor, such as poly silicon, at a polarity (p-type or n-type) which can be selected to adjust a threshold voltage and a concentration of about $1E18$-$1E21$ $cm^{-3}$. The conductive material may be deposited and then etched back to form the back gates 1020. Alternatively, the back gates 1020 may comprise metal, such as TiN, W, or a combination thereof. In an example, the back gates 1020 each may have a top surface substantially flush with or (slightly) higher than that of the substrate 1000.

After the back gates are formed as described above, the substrate 1000 may be patterned to form the fins.

Figure 10:
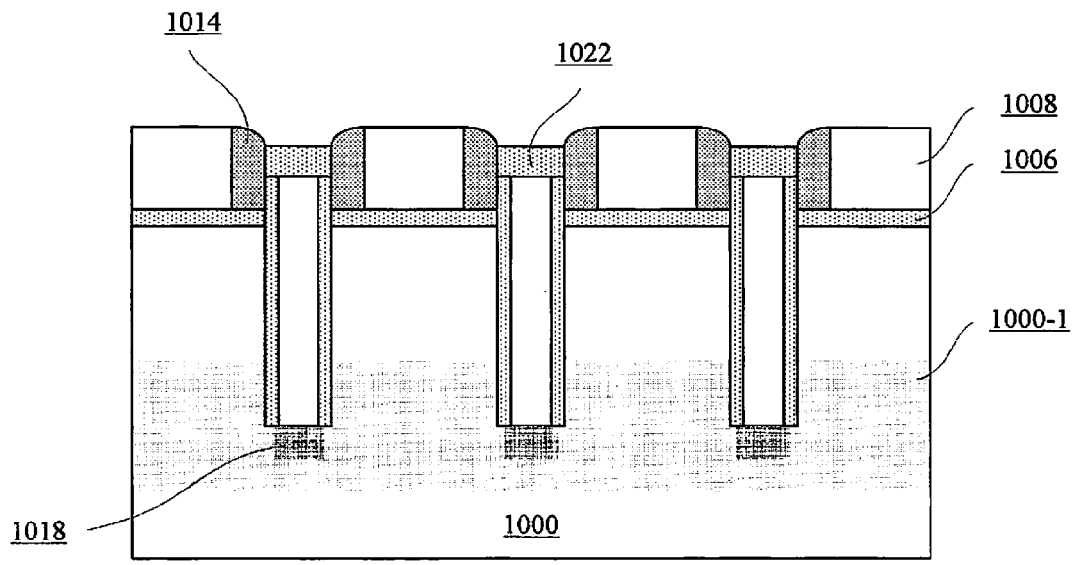

In this embodiment, FinFETs with a gate stack intersecting the fins are to be formed. A dielectric layer 1022 may be further filled into the back gate grooves BG to cover the back gates 1020, as shown in FIG. 10. For example, the dielectric layer 1022 may comprise oxide, and may be formed by depositing and then etching back an oxide layer. Further, before filling the dielectric layer 1022, portions of the back gate dielectric layers 1016 exposed by the respective back gates 1020 may be selectively removed, so that back gate stacks (specifically, the respective back gates 1026 and the respective back gate dielectric layers 1016) can be entirely covered by the dielectric layer 1022, to avoid unwanted impacts thereon during later processes. Further, the protection layer 1010 on top of the patterning auxiliary layer 1008 may be selectively removed. This can be done by, for example, RIE the protection layer 1010 (e.g., nitride) with respect to the dielectric layer 1022 (e.g., oxide).

Figure 11:
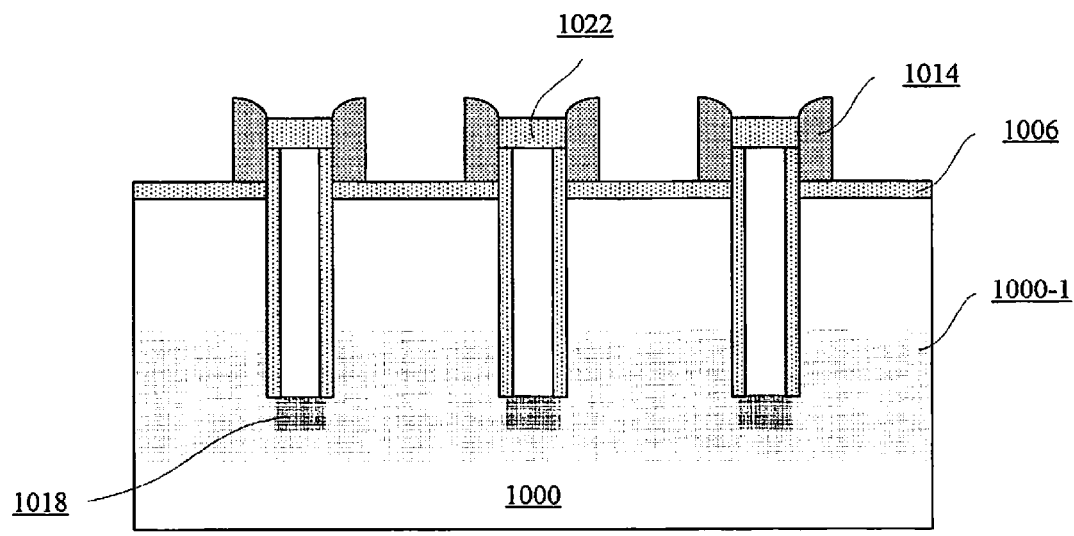
Figure 12:
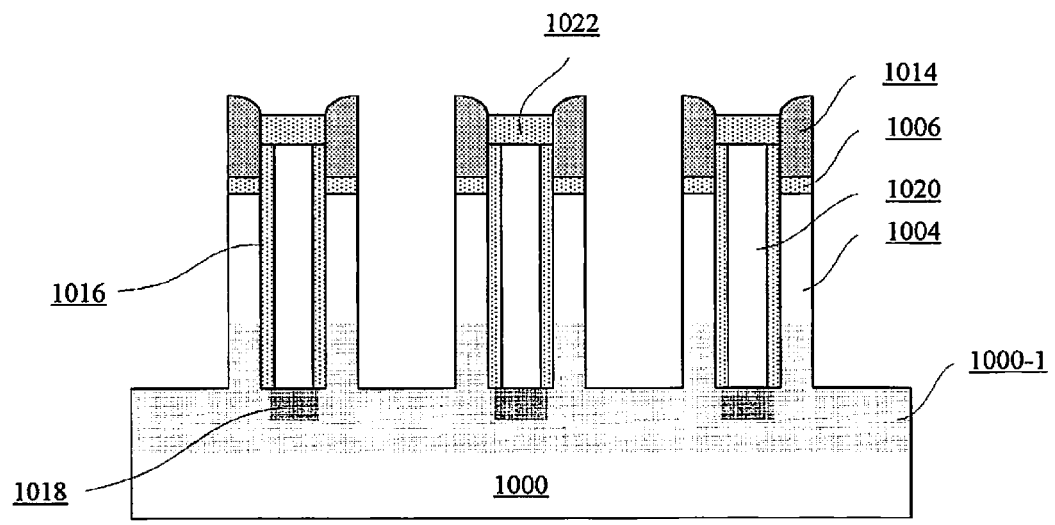

Next, as shown in FIG. 11, the patterning auxiliary layer 1008 may be removed by selective etching, for example, wet etching with TMAH solution, to leave the pattern transfer layer 1014. Then, the stop layer 1006 and the substrate 1000 may be selectively etched by, e.g., RIE, with the pattern transfer layer 1014 as a mask. As a result, fin-like portions 1004 of the substrate are left on opposite sides of the respective back gates 1020, as shown in FIG. 12. Those fin-like portions correspond to the pattern transfer layer 1014 in shape.

In FIG. 12, the fins 1004 each are shown as having its bottom substantially flush with the bottom of the respective back gates 1020. However, the present disclosure is not limited thereto. According to embodiments of the present disclosure, in order that the back gates 1020 can effectively control the respective fins 1004, the fins 1004 may have a vertical extent not beyond that of the respective back gates 1020.

In this way, a preliminary sFin configuration according to this embodiment is achieved. As shown in FIG. 12, the preliminary sFin configuration comprises the back gate 1020 and the fins 1004 on opposite sides of the back gate 1020, with the back gate dielectric layers 1016 interposed between the back gate 1020 and the respective fins 1004. Further, the dielectric layer 1022 is disposed on top of the back gate 1020.

In the preliminary sFin shown in FIG. 12, remaining portions of the pattern transfer layer 1014 and the stop layer 1016 are also shown. Those remaining portions may have no substantial impacts on later processes, and thus can be left as they are for simplification. Certainly, they can be removed as needed.

In this preliminary sFin, the back gate 1020 has not been further patterned. In this embodiment, the further patterning of the back gate 1020 may be performed together with the manufacture processes of the FET. However, the present disclosure is not limited thereto. For example, the further patterning of the back gate can be performed separately.

In the example shown in FIG. 12, there are three preliminary sFins. However, the present disclosure is not limited thereto. For example, more or less preliminary sFins may be formed as desired, and the preliminary sFins may be formed in a different layout than that shown in the figures where the preliminary sFins are disposed in parallel.

In the following, an exemplary flow of making sFinFETs will be described.

Figure 13:
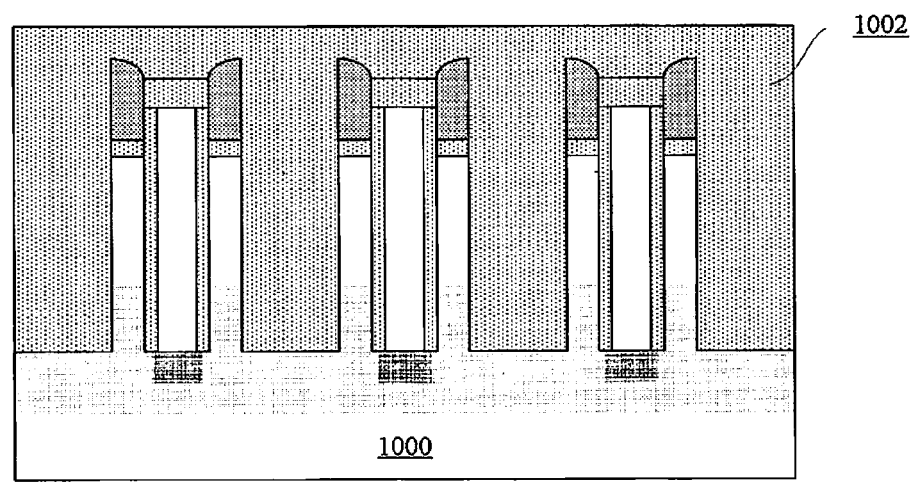

To make the sFinFETs, an isolation layer may be formed on the substrate 1000. For example, as shown in FIG. 13, a dielectric layer 1002 (e.g., oxide) may be formed by, e.g., deposition, on the substrate, and then etched back to form the isolation layer. Generally, the deposited dielectric layer can cover the preliminary sFins entirely, and may be planarized by, e.g., Chemical Mechanical Polishing (CMP), before being etched back. Preferably, the planarization of the deposited dielectric layer may be carried out by sputtering. For example, the sputtering can be done with plasma, such as plasma of Ar, N, or the like.

Figure 14:
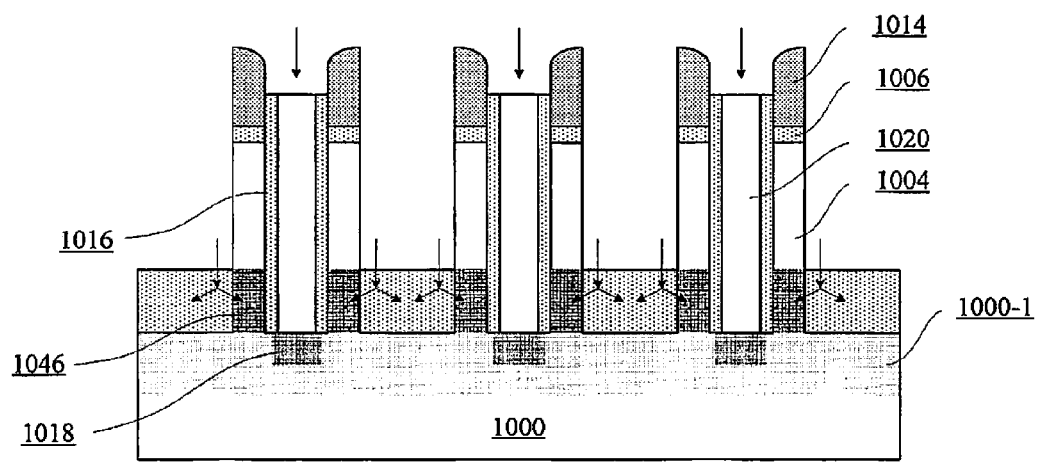

When etching back the dielectric layer 1002, the dielectric layer 1022 on top of the back gates 1022 (including oxide like the dielectric layer 1002) may be also removed, as shown in FIG. 14. Thus, the back gates 1020 are exposed.

In the case where the well region 1000-1 is formed in the substrate, a top surface of the well region may be not lower than that of the isolation layer 1002 (referring to FIG. 14). For example, the top surface of the isolation layer 1002 may be set to slightly expose the well region. That is, the top surface of the isolation layer 1002 may be slightly lower than the top surface of the well region 1000-1 (with a height difference therebetween not shown in the drawings).

To improve the device performances, especially, to reduce source/drain leakage, a Punch-Through Stopper (PTS) 1046 may be formed by ion implantation, as shown by arrows in FIG. 14. For example, p-type impurities, such as B, $BF_2$ or In, may be implanted for an n-type device, and n-type impurities, such as As or P, may be implanted for a p-type device. The ion implantation may be carried out substantially perpendicular to the surface of the substrate. Parameters adopted in the ion implantation may be controlled so that the PTS is formed in portions of the fins 1004 underneath the surface of the isolation layer 1006 and has a desired doping concentration of, e.g., 5E17-2E19 $cm^{-3}$, greater than that of the well region 1000-1. It is to be noted that the formal factor of the sFins (being elongate) and the dielectric layers on top thereof facilitate forming a steep doping profile in the depth direction. Annealing, such as spike annealing, laser annealing, and/or rapid annealing, may be performed to activate the implanted dopants. The PTS helps reduce the source/drain leakage.

Because the top surfaces of the respective back gates 1020 are exposed, the ion implantation may enter the back gates 1020 (especially top ends thereof). If needed, RIE may be performed on the back gates 1020 to remove some portions of their top ends. Then, a dielectric layer 1024 (referring to FIG. 15) may be further formed to cover the back gates 1020 by depositing and then etching back, for example, oxide.

Figure 15:
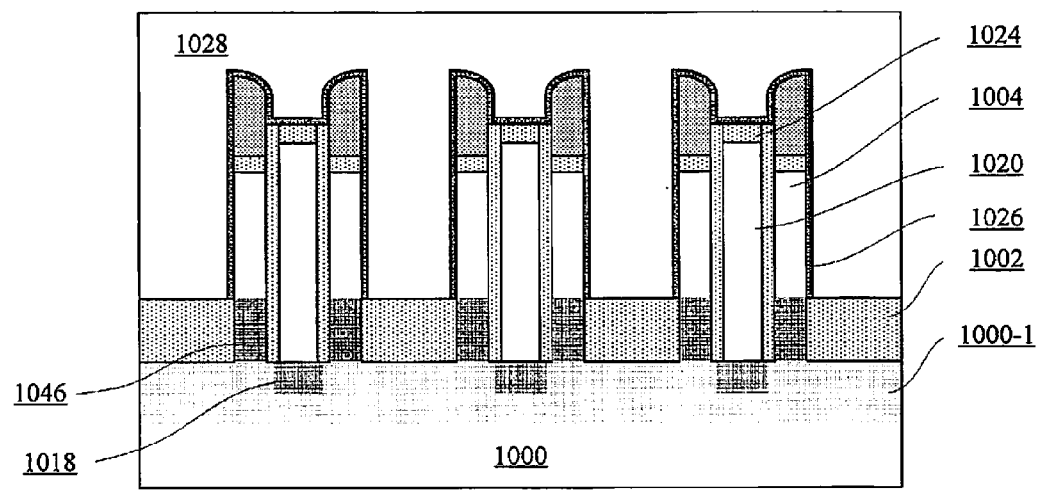

Next, a gate stack may be formed on the isolation layer 1002 to intersect the preliminary sFins. For example, this can be done as follows. Specifically, as shown in FIG. 15, a gate dielectric layer 1026 may be formed by, e.g., deposition. For example, the gate dielectric layer 1026 may comprise oxide, with a thickness of about 0.8-1.5 nm. In the example shown in FIG. 15, the gate dielectric layer 1026 is shown to be on side and top surfaces of the preliminary sFins. However, the gate dielectric layer 1026 may extend onto a top surface of the isolation layer 1002. Then, a gate conductor layer 1028 may be formed by, e.g., deposition. For example, the gate conductor layer 1028 may comprise poly silicon. The gate conductor layer 1028 may fill gaps between the preliminary sFins, and be planarized by, e.g., CMP.

Figure 16:
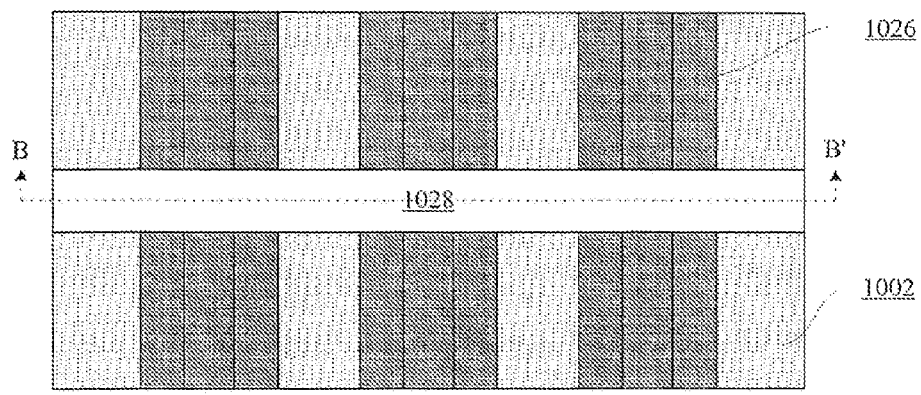
Figure 16:
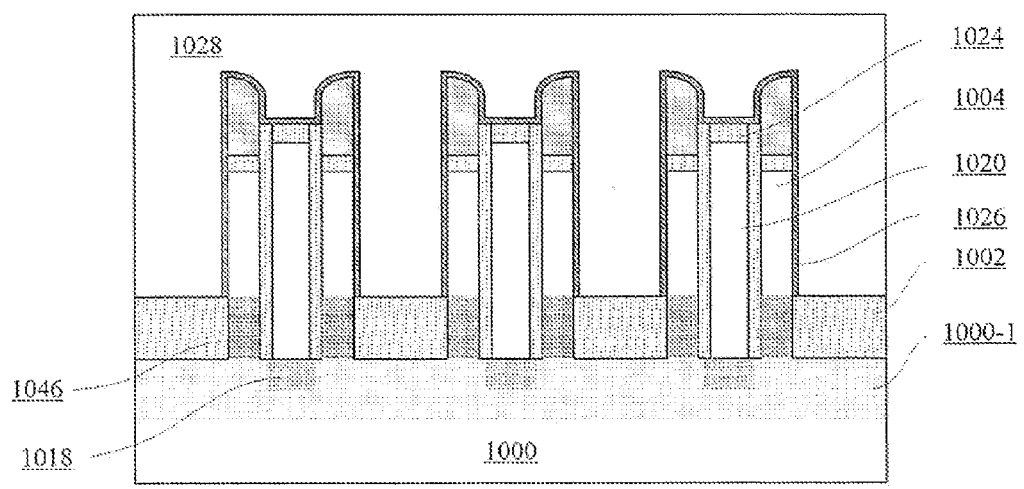

As shown in FIG. 16 (where FIG. 16(*b*) is a sectional view taken along BB' in FIG. 16(*a*)), the gate conductor layer 1028 may be patterned. In the example shown in FIG. 16, the gate conductor layer 1028 may be patterned to a bar crossing the preliminary sFins. According to a further embodiment, the gate dielectric layer 1026 may be further patterned with the patterned gate conductor layer 1028 as a mask.

After formation of the patterned gate conductor, halo implantation and extension implantation may be carried out with the gate conductor as a mask.

Figure 17:
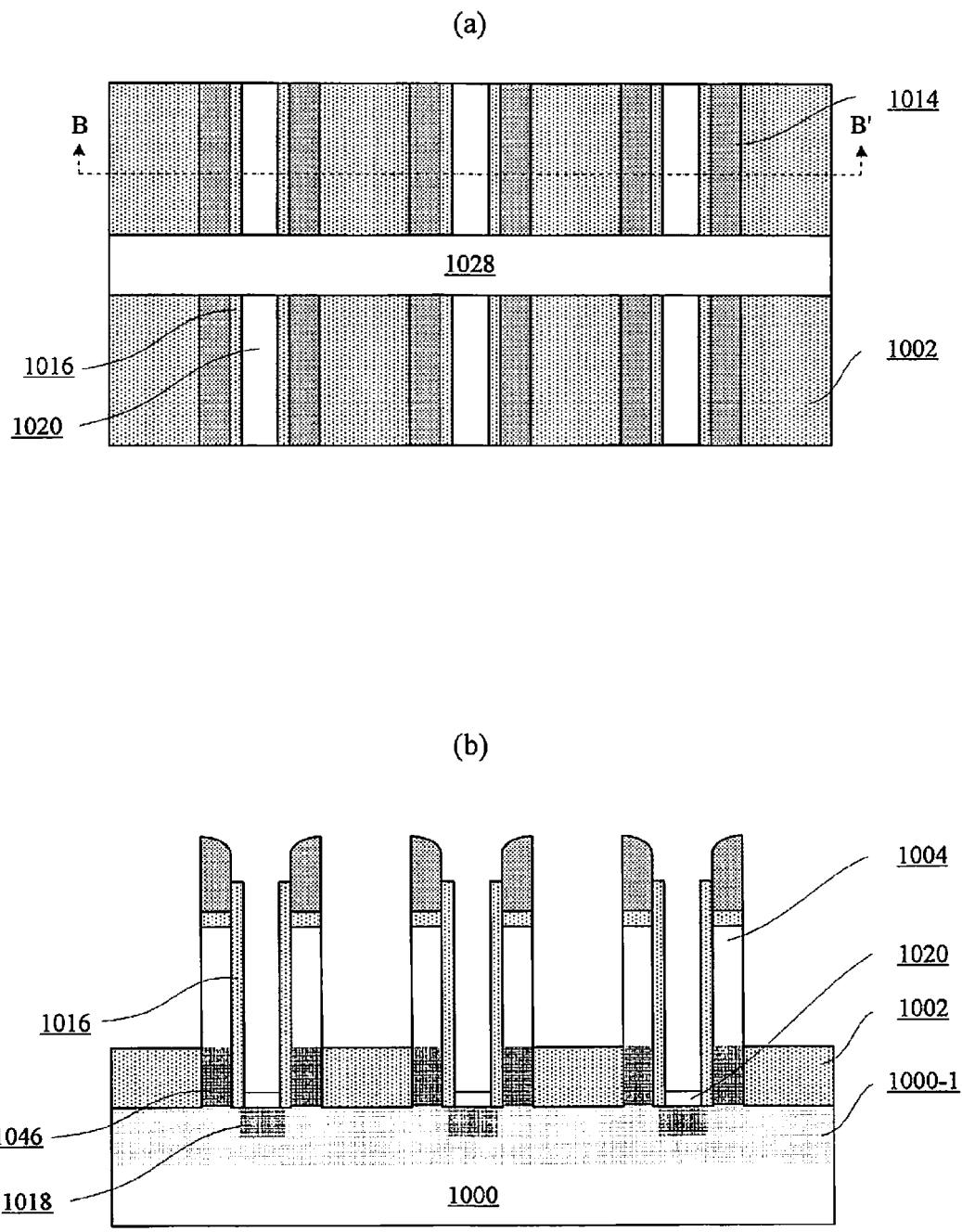

Thus, the gate stack defines a "middle portion" of each of the back gates in the respective preliminary sFins (a portion of the back gate underlying the gate stack). As a result, it is possible to further pattern the back gates in a relatively easy manner. Specifically, as shown in FIG. 17, portions of the gate dielectric layer 1026, the dielectric layer 1024 and the back gates 1020 on opposite sides of the gate conductor layer 1028 may be selectively removed by, e.g., RIE (in which the removal of the portions of the gate dielectric layer 1026 can be omitted if the gate dielectric layer 1026 has been patterned as described above). Here, the portions of the back gates 1020 may be removed partially or even entirely. Thus, the back gates 1020 are each patterned into a shape where end portions on opposite sides of the middle portion are recessed with respect to the middle portion (referring to FIG. 18(*c*)) so that it looks as a whole like " 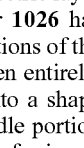 ." As a result, the preliminary sFins with the back gates further patterned constitute the sFins according to this embodiment.

Figure 18:
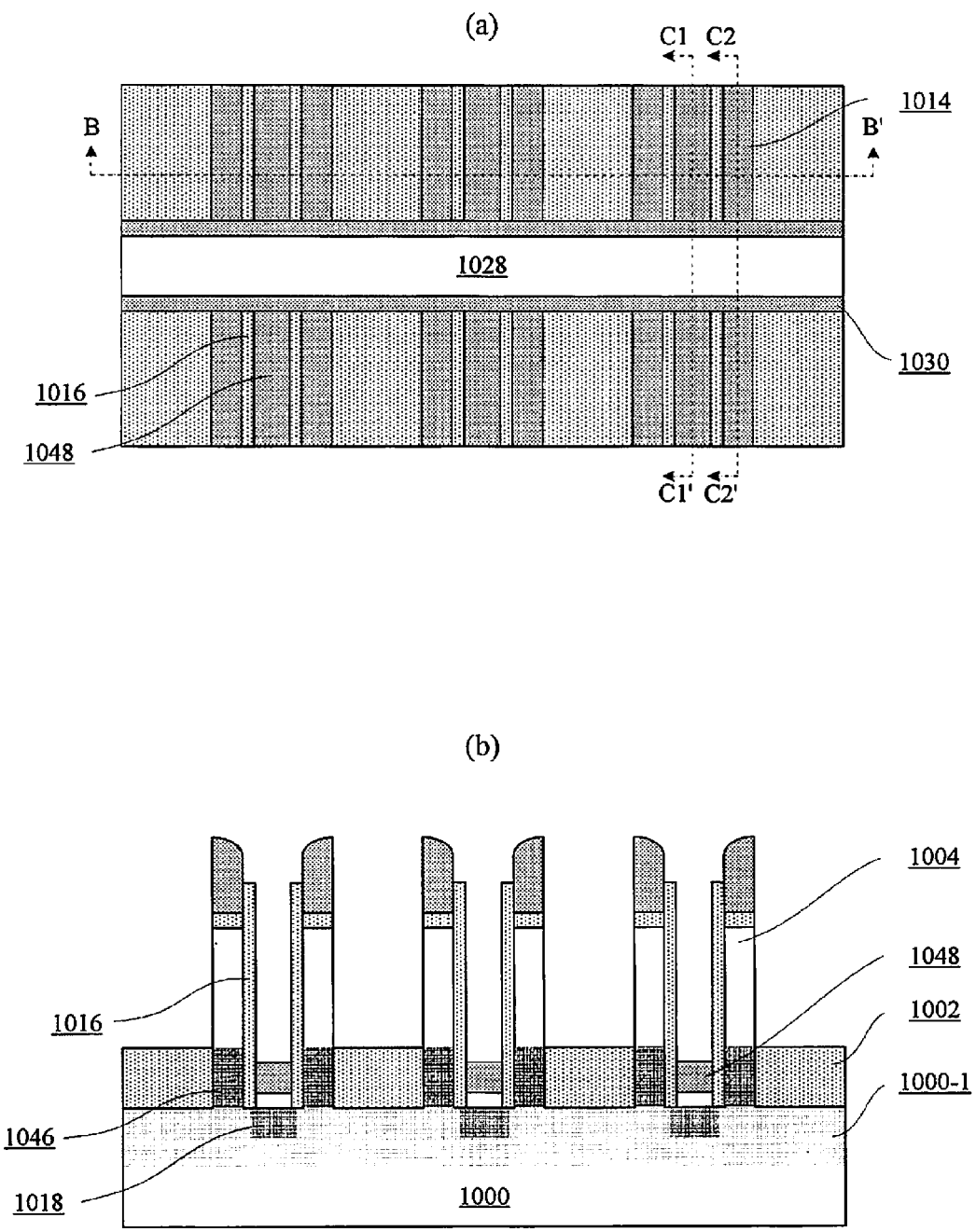

Next, as shown in FIG. 18 (where FIG. 18(*b*) is a sectional view taken along BB' in FIG. 18(*a*), FIG. 18(*c*) is a sectional view taken along C1C1' in FIG. 18(*a*), and FIG. 18(*d*) is a sectional view taken along C2C2' in FIG. 18(*a*)), gate spacers 1030 may be formed on sidewalls of the gate conductor layer 1028. For example, a nitride layer (e.g., silicon nitride) with a thickness of about 5-20 nm may be deposited and then etched by RIE, to form the spacers 1030. Here, the amount of RIE may be controlled in forming the gate spacers, so that the gate spacers 1030 have substantially no portions on the sidewalls of the sFins. There are various ways to form the spacers, and detailed descriptions thereof are omitted here.

Further, top surfaces of the end portions of the respective back gates 1020 may be covered by a dielectric layer 1048. For example, the dielectric layer 1048 may comprise nitride, and may be formed together with the gate spacers, for simplification. In an example, a top surface of the dielectric layer 1048 may lie between top and bottom surfaces of the PTS 1046.

After formation of the spacers, source/drain (S/D) implantation may be carried out with the gate conductor and the spacers as a mask. Then, annealing may be performed to activate implanted ions to form S/D regions, resulting in sFinFETs.

Figure 19:
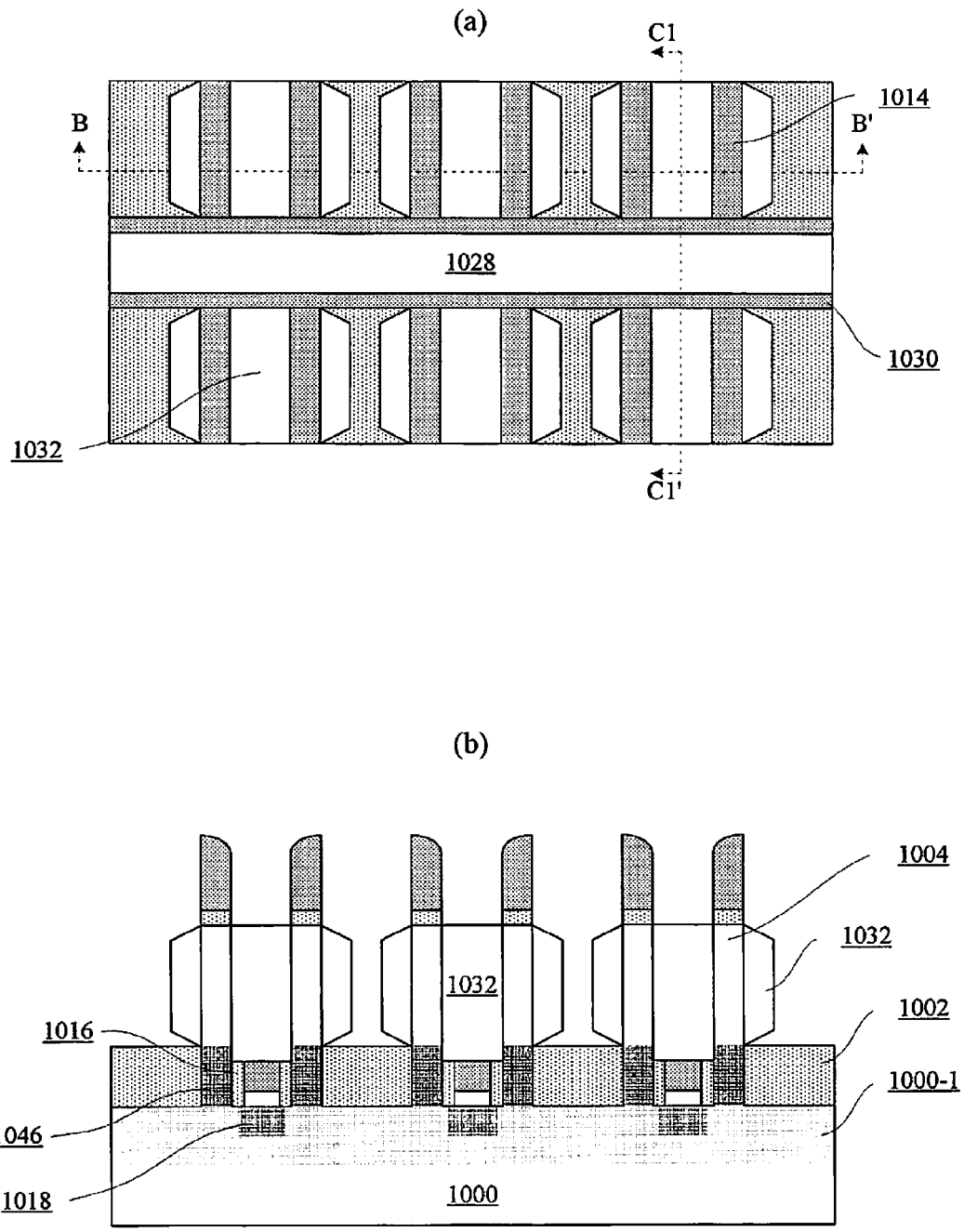
Figure 19:
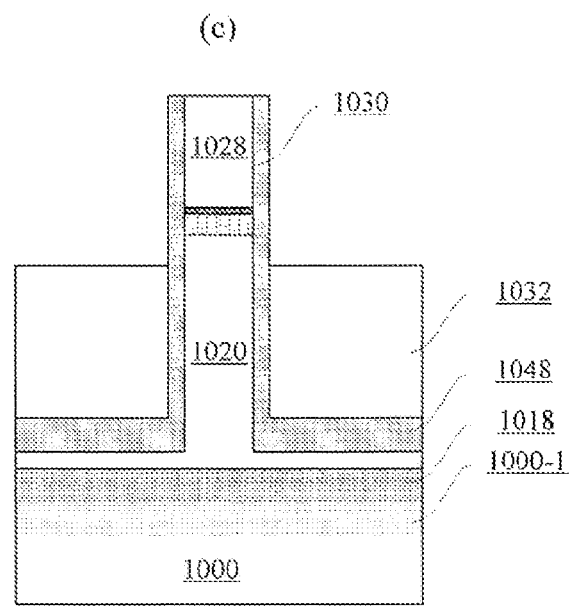

To improve the device performances, in an example the strained S/D technology may be utilized. Specifically, as shown in FIG. 19 (where FIG. 19(*b*) is a sectional view taken along BB' in FIG. 19(a), and FIG. 19(c) is a sectional view taken along C1C1' in FIG. 19(a)), on exposed surfaces of the fins 1004 by the gate stack (corresponding to the S/D regions), a semiconductor layer 1032 may be formed by epitaxy. Before the epitaxy, exposed portions of the back gate dielectric layers 1016 may be selectively removed (referring to FIG. 18(b)). As a result, the semiconductor layer 1032 may be grown on surfaces of the fins 1004 facing the respective back gates. In the example shown in FIG. 19, the semiconductor layer 1032 is shown as connecting the two fins 1004 together.

In an example, the semiconductor layer 1032 may be doped in-situ during the epitaxy. For example, the semiconductor layer 1032 may be n-type doped in-situ for an n-type device, or p-type doped in situ for a p-type device. To further improve the device performances, the semiconductor layer 1032 may comprise a different material from the fins 1004, to apply stress to the fins 1004 (where the channel regions are to be formed). For example, in a case where the fins 1004 comprise Si, the semiconductor layer 1032 may comprise Si:C (where an atomic percentage of C may be about 0.2-2%, for example) for an n-type device to apply tensile stress, or SiGe (where an atomic percentage of Ge may be about 15-75%, for example) for a p-type device to apply compressive stress. On the other hand, the grown semiconductor layer 1032 extends the source/drain regions laterally to an extent, facilitating formation of contacts to the S/D regions.

In a case where the gate conductor layer 1028 comprises poly silicon, growth of the semiconductor layer 1032 may also occur on the gate conductor layer 1028. This is not shown in the figure.

In the above embodiment, the gate stack is directly formed after formation of the sFins. However, the present disclosure is not limited thereto. For example, a gate last process also applies.

According to another embodiment of the present disclosure, the gate dielectric layer 1026 and the gate conductor layer 1028 shown in FIG. 15 are a sacrificial gate dielectric layer and a sacrificial gate conductor layer, respectively. (In this case, operations described with reference to FIGS. 15 and 16 result in a sacrificial gate stack.) Next, the back gates may be patterned in the same way as described above with reference to FIG. 17, and the gate spacers 1030 may be formed in the same way as described above with reference to FIG. 18. Likewise, the strained S/D technology may be also applied as described with reference to FIG. 19.

Then, the sacrificial gate stack may be handled according to the gate last process to form a real gate stack. For example, this can be done as follows.

Figure 20:
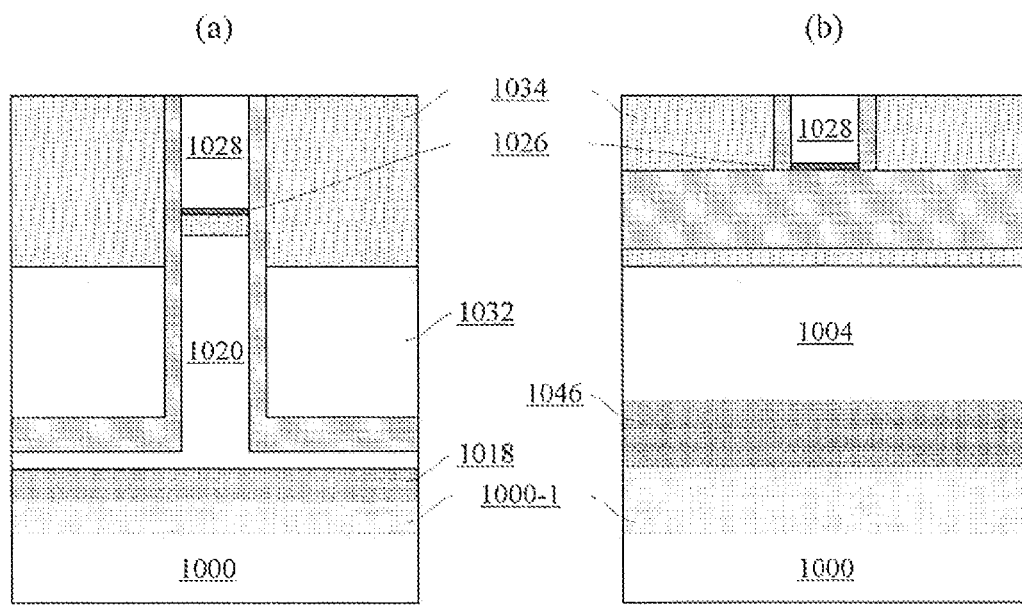
Figure 21:
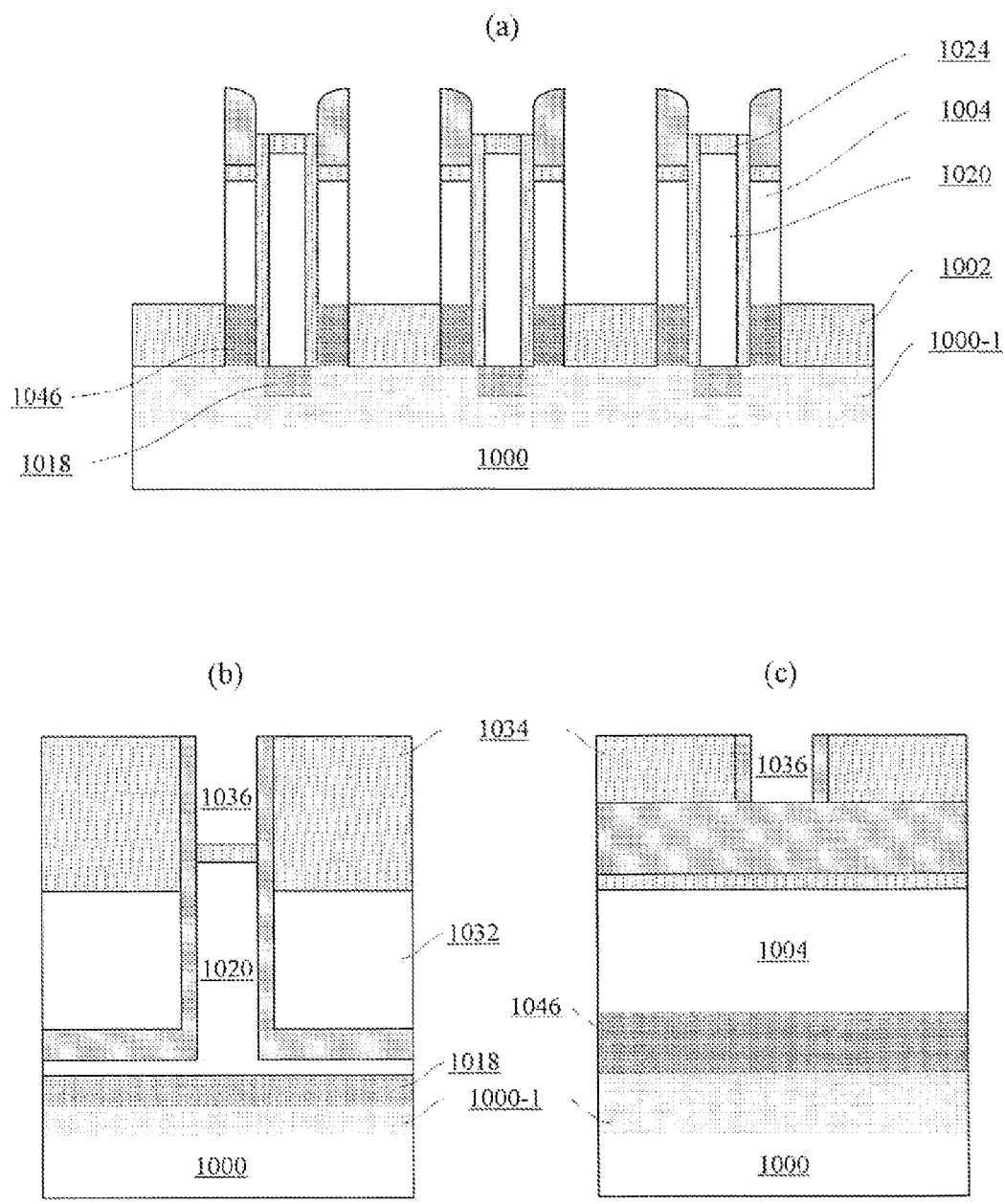

Specifically, as shown in FIG. 20 (where FIG. 20(a) is a sectional view corresponding to that of FIG. 18(c), and FIG. 20(b) is a sectional view corresponding to that of FIG. 18(d)), a dielectric layer 1034 may be formed by, e.g., deposition. The dielectric layer 1034 may comprise oxide. Then, the dielectric layer 1034 may be planarized by, e.g., CMP. The CMP may stop at the gate spacers 1030, and thus the sacrificial gate conductor layer 1028 is exposed. Next, as shown in FIG. 21 (where FIG. 21(a) is a sectional view corresponding to that of FIG. 18(b), FIG. 21(b) is a sectional view corresponding to that of FIG. 20(a), and FIG. 21(c) is a sectional view corresponding to that of FIG. 20(b)), the sacrificial gate conductor layer 1028 may be selectively removed by means of, e.g., TMAH solution, leaving a gate groove 1036 between the gate spacers 1030. According to a further embodiment, the sacrificial gate dielectric layer 1026 may be further removed.

Figure 22:
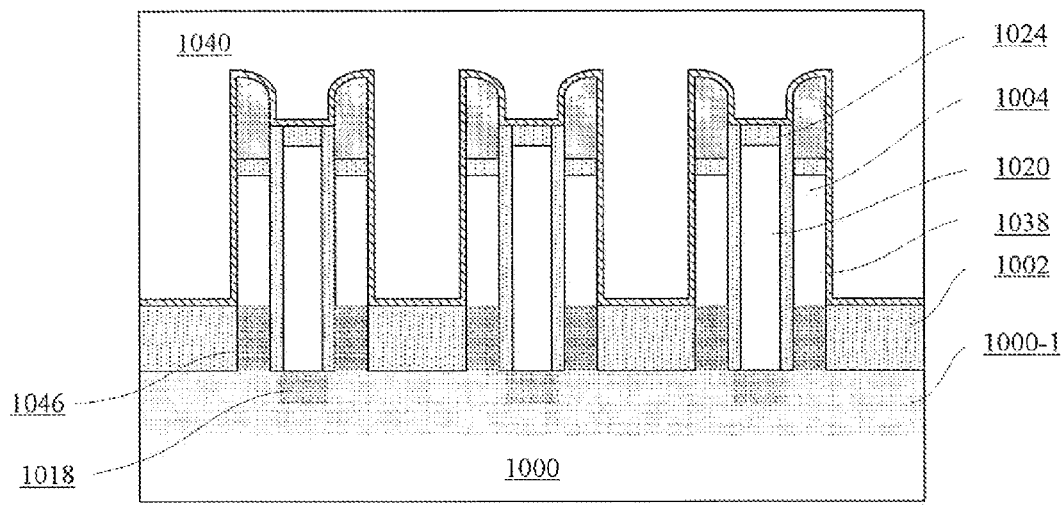
Figure 22:
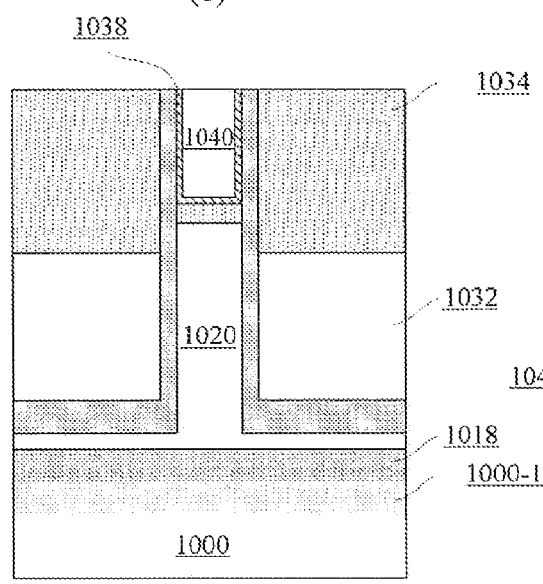
Figure 22:
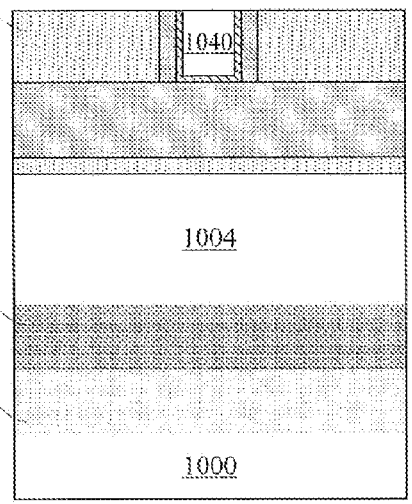
Figure 23:
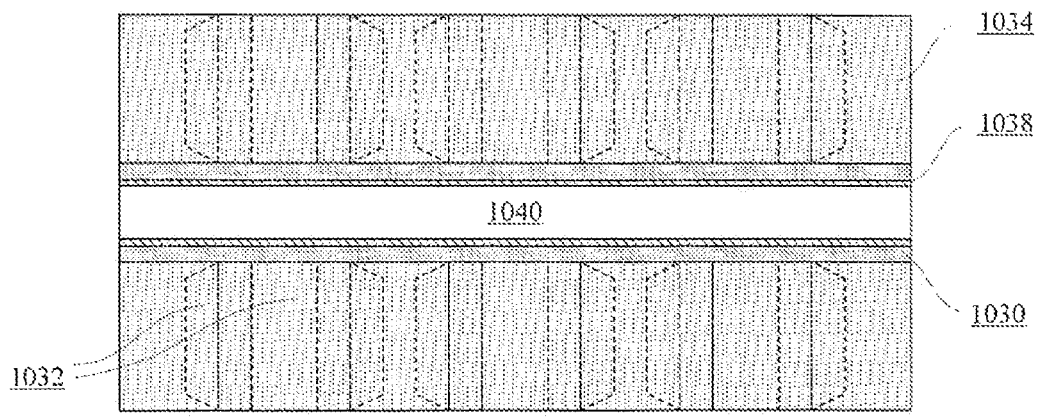

Then, as shown in FIG. 22 (where FIGS. 22(a), 22(b), and 22(c) are sectional views respectively corresponding to those of FIGS. 21(a), 21(b), and 21(c)) and FIG. 23 (which is a top view showing the arrangement of FIG. 22), a final gate stack may be formed by forming a gate dielectric layer 1038 and a gate conductor layer 1040 in the gate groove. The gate dielectric layer 1038 may comprise a high-K gate dielectric material such as $HfO_2$, with a thickness of about 1-5 nm. Further, the gate dielectric layer 1038 may further comprise a thin oxide layer (on which the high-K gate dielectric is disposed), with a thickness of about 0.3-1.2 nm. The gate conductor layer 1040 may comprise a metal gate conductor. There may be a work function adjustment layer (not shown) interposed between the gate dielectric layer 1038 and the gate conductor layer 1040.

Thus, sFinFETs according to this embodiment are achieved. As shown in FIGS. 22 and 23, the sFinFET comprises the gate stack (including the gate dielectric layer 1038 and the gate conductor layer 1040) formed on the substrate 1000 and intersecting the sFin (including the back gate 1020 and the fins 1004). As clearly shown in FIG. 22(a), the gate conductor layer 1040 may control generation of conductive channels in a side surface (opposite to the back gate 1020) of each of the fins 1004 via the gate dielectric layer 1038. Further, the back gate 1020 may control the fins 1004 via the respective back gate dielectric layers 1016, and thus adjust the threshold of the sFinFET as desired. The back gate 1020 is electrically isolated from the gate stack and the source/drain regions by the dielectric layers 1024 and 1048.

Figure 24:
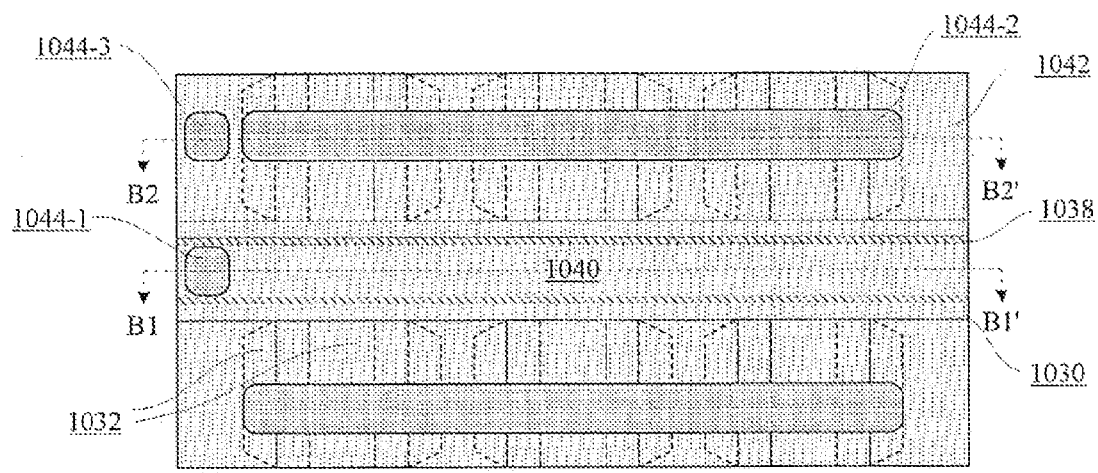

After formation of the sFinFETs, various electric contacts may be formed. For example, as shown in FIG. 24, an Interlayer Dielectric (ILD) layer 1042 may be formed on a surface of the arrangement of FIG. 21. The ILD layer 1042 may comprise oxide. The ILD layer 1042 may be planarized by, e.g., CMP, to have a substantially planar surface. Then, contact holes may be formed by means of, e.g., photolithography, and then filled by a conductive material, e.g., metal (such as W, Cu, or the like), to form contacts, such as a contact 1044-1 to the gate stack, contacts 1044-2 to the S/D regions, and a contact 1044-3 to the back gate.

Figure 25:
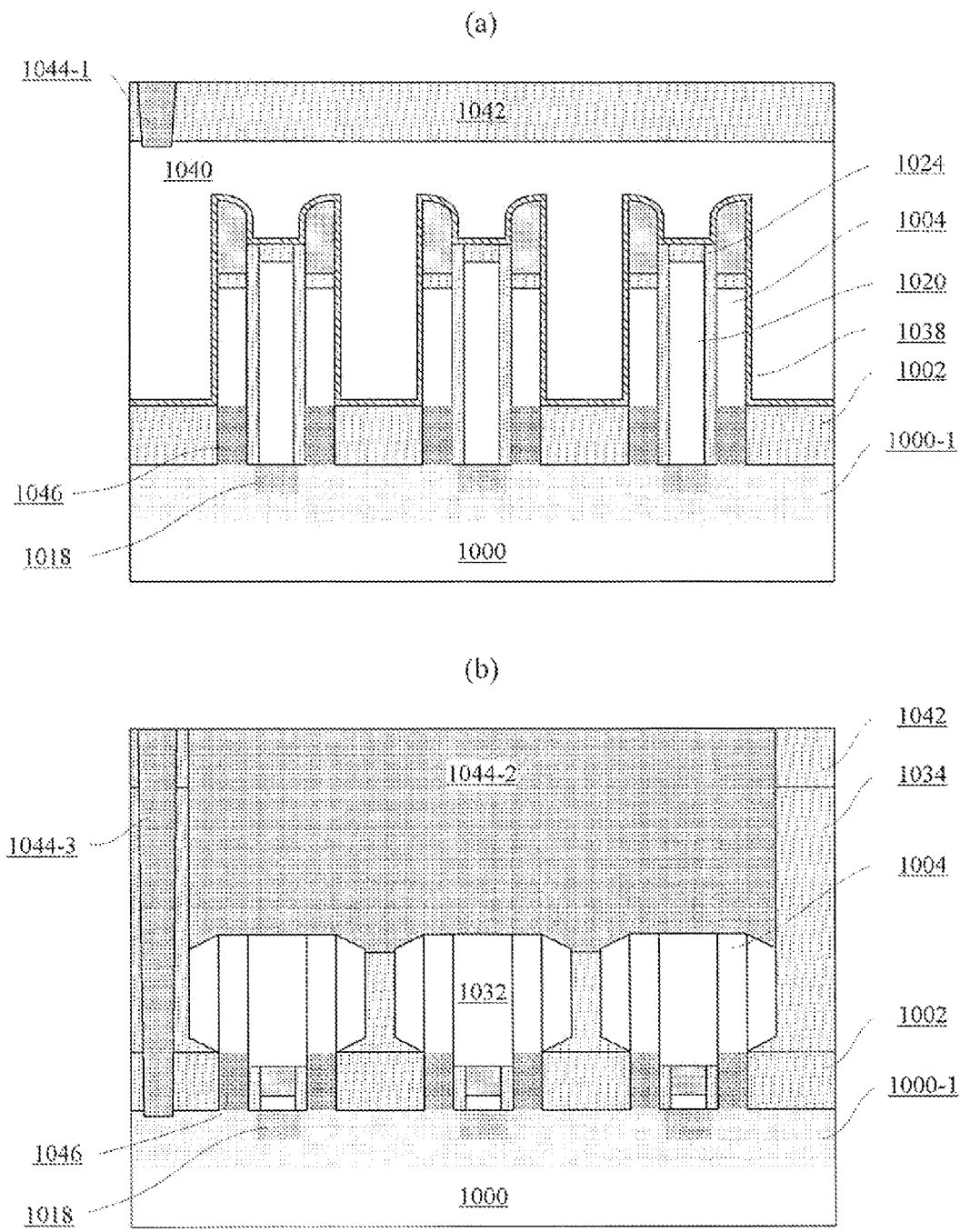

FIG. 25 shows sectional views taken along B1B1' and B2B2' of FIG. 24 in (a) and (b), respectively. As shown in FIG. 25, the contact 1044-1 passes through the ILD layer 1042, and accesses and thus is in electric contact with the gate conductor 1040; the contacts 1044-2 pass through the ILD layer 1042 and the dielectric layer 1034, and access and thus are in electric contact with the S/D regions (the semiconductor layer 1032 in this example); and the contact 1044-3 passes through the ILD layer 1042, the dielectric layer 1034, and the isolation layer 1002, and accesses the substrate 1000 (especially, the well region 1000-1) and thus is in electric contact with the back gate 1020. Desired electrical signals may be applied through those electrical contacts.

In FIG. 25, the source or drain regions of the three sFinFETs are shown to be connected to the same contact. However, the present disclosure is not limited thereto. Different connections can be made based on different designs.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above. The mere fact that the various embodiments are described separately does not mean that means recited in the respective embodiments cannot be used in combination to advantage.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

I claim:

1. A semiconductor arrangement, comprising:
a substrate;
a back gate formed on the substrate;
fins formed on opposite sides of the back gate; and
back gate dielectric layers interposed between the back gate and the respective fins,
wherein the back gate has opposite end portions recessed with respect to a middle portion thereof between the end portions, so that an overlap area between each of the end portions and each of the fins is smaller than an overlap area between the middle portion and the fin.

2. The semiconductor arrangement according to claim 1, wherein the back gate has a top surface in the middle portion substantially flush with or higher than that of each of the fins.

3. The semiconductor arrangement according to claim 1, wherein the overlap area between the end portion and the fin is substantially zero.

4. The semiconductor arrangement according to claim 1, wherein the back gate comprises a conductive material, with a width of about 5-30 nm.

5. The semiconductor arrangement according to claim 1, wherein the fin comprises any of Si, Ge, SiGe, GaAs, GaSb, AlAs, InAs, InP, GaN, SiC, InGaAs, InSb, or InGaSb, with a width of about 3-28 nm.

6. The semiconductor arrangement according to claim 1, wherein the back gate dielectric layer comprises oxide, with an equivalent thickness of about 10-30 nm.

7. The semiconductor arrangement according to claim 1, further comprising a dielectric layer on top of the back gate.

8. The semiconductor arrangement according to claim 7, further comprising:
an isolation layer formed on the substrate and exposing a portion of each of the fins; and
a gate stack formed on the isolation layer and intersecting the fins and the middle portion of the back gate.

9. The semiconductor arrangement according to claim 8, further comprising a well region in the substrate, wherein the back gate is in electric contact with the well region.

10. The semiconductor arrangement according to claim 8, further comprising a punch-through stopper formed beneath the portions of the fins exposed by the isolation layer, with a doping concentration higher than that in the well region.

11. The semiconductor arrangement according to claim 10, wherein portions of the dielectric layer on top of the end portions of the back gate have a top surface lying between a top surface and a bottom surface of the punch-through stopper.

12. The semiconductor arrangement according to claim 8, further comprising a semiconductor layer grown on surfaces of portions of each of the fins on opposite sides of the gate stack.

13. The semiconductor arrangement according to claim 12, wherein the semiconductor layer is compressive stressed if the semiconductor arrangement is used for a p-type device, or is tensile stressed if the semiconductor arrangement is used for an n-type device.

14. A method of manufacturing a semiconductor arrangement, comprising:
forming a back gate groove in a substrate;
forming back gate dielectric layers on sidewalls of the back gate groove;
forming a back gate by filling a conductive material into the back gate groove;
forming fins abutting the respective back gate dielectric layers by patterning the substrate; and
patterning the back gate in such a manner that the back gate has opposite end portions recessed with respect to a middle portion thereof between the end portions, so that an overlap area between each of the end portions and each of the fins is smaller than an overlap area between the middle portion and the fin.

15. The method according to claim 14, further comprising removing at least partially portions of the back gate dielectric layers exposed by the back gate after being patterned.

16. The method according to claim 14, wherein
forming the back gate groove comprises:
forming a patterning auxiliary layer on the substrate and patterning the patterning auxiliary layer to have an opening at a position corresponding to the back gate groove;
forming a pattern transfer layer on sidewalls of the patterning auxiliary layer facing the opening; and
forming the back gate groove by etching the substrate with the patterning auxiliary layer and the pattern transfer layer as a mask, and
forming the fins comprises:
selectively removing the patterning auxiliary layer; and
forming the fins by etching the substrate with the pattern transfer layer as a mask.

17. The method according to claim 16, wherein the conductive material filled into the back gate groove has a top surface substantially flush with or higher than that of the substrate.

18. The method according to claim 16, wherein the substrate comprises any of Si, Ge, SiGe, GaAs, GaSb, AlAs, InAs, InP, GaN, SiC, InGaAs, InSb, or InGaSb, and the patterning auxiliary layer comprises amorphous silicon, and
wherein the method further comprises forming a protection layer on a top surface of the patterning auxiliary layer to protect the patterning auxiliary layer during the etching of back gate groove.

19. The method according to claim 18, further comprising forming a stop layer on the substrate, wherein the patterning auxiliary layer is disposed on the stop layer.

20. The method according to claim 19, wherein the protection layer comprises nitride, the pattern transfer layer comprises nitride, and the stop layer comprises oxide.

21. The method according to claim 16, wherein the pattern transfer layer is formed on the sidewalls of the patterning auxiliary layer in a spacer formation process.

22. The method according to claim 14, wherein after forming the back gate and before patterning the substrate, the method further comprises: forming a dielectric layer in the back gate groove to cover the back gate.

23. The method according to claim 22, wherein after forming the fins and before patterning the back gate, the method further comprises:
forming an isolation layer, which exposes a portion of each of the fins, on the substrate; and
forming a gate stack on the isolation layer to intersect the fins and the back gate.

24. The method according to claim 23, wherein pattering the back gate comprises:
   patterning the back gate with the gate stack as a mask to remove at least partially portions of the back gate on opposite sides of the gate stack.

25. The method according to claim 24, further comprising forming a further dielectric layer in portions of the back gate groove on opposite sides of the gate stack.

26. The method according to claim 14, wherein the back gate dielectric layers are formed on the sidewalls of the back gate groove in a spacer formation process.

* * * * *